US012241937B2

(12) United States Patent
Bin Azahar et al.

(10) Patent No.: US 12,241,937 B2
(45) Date of Patent: Mar. 4, 2025

(54) ESTIMATION DEVICE, ESTIMATION METHOD, AND COMPUTER PROGRAM

(71) Applicant: GS Yuasa International Ltd., Kyoto (JP)

(72) Inventors: Muhammad Syahid Fitri Bin Azahar, Kyoto (JP); Yasuyuki Hamano, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 340 days.

(21) Appl. No.: 17/765,597

(22) PCT Filed: Oct. 2, 2020

(86) PCT No.: PCT/JP2020/037503
§ 371 (c)(1),
(2) Date: Mar. 31, 2022

(87) PCT Pub. No.: WO2021/066128
PCT Pub. Date: Apr. 8, 2021

(65) Prior Publication Data
US 2022/0404420 A1    Dec. 22, 2022

(30) Foreign Application Priority Data

Oct. 3, 2019  (JP) ................................ 2019-183337

(51) Int. Cl.
*G01R 31/379* (2019.01)
*G01R 31/367* (2019.01)
*G01R 31/392* (2019.01)

(52) U.S. Cl.
CPC ......... *G01R 31/379* (2019.01); *G01R 31/367* (2019.01); *G01R 31/392* (2019.01)

(58) Field of Classification Search
CPC ................ G01R 31/379; G01R 31/392; G01R 31/367
See application file for complete search history.

(56) References Cited

U.S. PATENT DOCUMENTS 7,795,874 B1 * 9/2010 Kirchev ................ H01M 10/48
324/426
2011/0288691 A1   11/2011 Abe et al.
(Continued)

FOREIGN PATENT DOCUMENTS

| EP | 2386754 A1 | 11/2011 |
|----|------------|---------|
| EP | 2778697 A1 | 9/2014  |

(Continued)

OTHER PUBLICATIONS

International Search Report (ISR) dated Dec. 1, 2020 filed in PCT/JP2020/037503.

*Primary Examiner* — Walter L Lindsay, Jr.
*Assistant Examiner* — Milton Gonzalez
(74) *Attorney, Agent, or Firm* — RANKIN, HILL & CLARK LLP

(57) ABSTRACT

An estimation device includes: a derivation unit deriving a derivation history based on a current, a voltage and a temperature of a lead-acid battery; a first specifying unit specifying a specific gravity of an electrolyte solution; a second specifying unit specifying at least one of: a first degree of softening of a positive electrode material; a second degree of corrosion of a positive electrode grid; a third degree of sulfation of a negative electrode; and a fourth degree of shrinkage of a negative electrode material based on the specified specific gravity, the derived derivation history, and at least one of respective first-third relationships between the specific gravity, respective first-third histories and the respective first-third degrees, and a fourth relationship between a fourth history and the fourth degree; and an estimation unit configured to estimate a degree of deterioration of the battery based on the specified degree.

12 Claims, 13 Drawing Sheets

(56) References Cited

U.S. PATENT DOCUMENTS

| | | |
|---|---|---|
| 2013/0085696 A1 | 4/2013 | Xu et al. |
| 2014/0285156 A1 | 9/2014 | Mukaitani et al. |
| 2014/0306667 A1 | 10/2014 | Mukaitani et al. |
| 2014/0312915 A1 | 10/2014 | Mukaitani et al. |
| 2019/0176639 A1 | 6/2019 | Kumar et al. |

FOREIGN PATENT DOCUMENTS

| | | | |
|---|---|---|---|
| IN | 200500813 I2 | * | 7/2006 |
| JP | 2013231441 A | | 11/2013 |
| JP | 2016109639 A | | 6/2016 |
| JP | 2019079629 A | | 5/2019 |

* cited by examiner

Fig. 5

| No. | Lifetime effective discharge capacity | Lifetime effective charge capacity | Lifetime effective overcharge capacity | Temperature cumulative value | Standing time | SOC stay time |
|---|---|---|---|---|---|---|
| 1 | | | | | | |
| 2 | | | | | | |
| 3 | | | | | | |
| ... | ... | ... | ... | ... | ... | ... |

| Specific gravity | Thickness of positive electrode grid | Diagnosis information | First degree | Second degree | Third degree | Fourth degree | Degree of deterioration |
|---|---|---|---|---|---|---|---|
| | | | 5 | 1 | 1 | 0 | 9 |
| | | | 2 | 5 | 0 | 2 | 8 |
| | | | 3 | 1 | 3 | 0 | 10 |
| ... | ... | ... | ... | ... | ... | ... | ... |

| No. | Lifetime effective discharge capacity | Lifetime effective charge capacity | Lifetime effective overcharge capacity | Temperature cumulative value | Standing time | SOC stay time |
|---|---|---|---|---|---|---|
| 1 | | | | | | |
| 2 | | | | | | |
| 3 | | | | | | |
| ... | ... | ... | ... | ... | ... | ... |
| 10 | | | | | | |

| Specific gravity | Thickness of positive electrode grid | Diagnosis information | First degree | Second degree | Third degree | Fourth degree | Degree of deterioration |
|---|---|---|---|---|---|---|---|
| | | | 0 | 0 | 0 | 0 | 1 |
| | | | 1 | 0 | 1 | 0 | 3 |
| | | | 2 | 1 | 1 | 0 | 4 |
| ... | ... | ... | ... | ... | ... | ... | ... |
| | | | 3 | 1 | 3 | 0 | 10 |

| No. | Lifetime effective discharge capacity | Lifetime effective charge capacity | Lifetime effective overcharge capacity | Temperature cumulative value | Standing time | SOC stay time |
|---|---|---|---|---|---|---|
| 1 | | | | | | |
| 2 | | | | | | |
| 3 | | | | | | |
| ... | ... | ... | ... | ... | ... | ... |
| 10 | | | | | | |

| Specific gravity | Thickness of positive electrode grid | Diagnosis information | First degree | Second degree | Third degree | Fourth degree |
|---|---|---|---|---|---|---|
| | | | 0 | 0 | 0 | 0 |
| | | | 1 | 0 | 1 | 0 |
| | | | 2 | 1 | 1 | 0 |
| ... | ... | ... | ... | ... | ... | ... |
| | | | 3 | 1 | 3 | 0 |

| Actually-measured first degree | Actually-measured second degree | Actually-measured third degree | Actually-measured fourth degree | Degree of deterioration | Actually-measured degree of deterioration |
|---|---|---|---|---|---|
| | | | | | 1 |
| 1 | 0 | 1 | 0 | 3 | 3 |
| 2 | 1 | 2 | 0 | 4 | 5 |
| ... | ... | ... | ... | ... | ... |
| | | | | 10 | |

ESTIMATION DEVICE, ESTIMATION METHOD, AND COMPUTER PROGRAM

TECHNICAL FIELD

The present invention relates to an estimation device, an estimation method, and a computer program for estimating deterioration of a lead-acid battery.

BACKGROUND ART

Lead-acid batteries are used in various applications in addition to in-vehicle applications and industrial applications. For example, a secondary battery (energy storage device) such as an in-vehicle lead-acid battery is mounted on a moving body such as a vehicle. Here, the vehicle includes an automobile, a motorcycle, a forklift, or a golf car, for example. The secondary battery is used as a power supply source that supplies electricity to a starter motor at the time of starting an engine and a power supply source to various electrical components such as lights. For example, a lead-acid battery for industrial use is used as an emergency power source or a power supply source to an uninterruptable power system (UPS).

It has been known that the deterioration of a lead-acid battery progresses due to various factors. To prevent stopping of the supply of electricity caused by the occurrence of a state where a lead-acid battery unexpectedly loses its function, it is necessary to appropriately determine the degree of deterioration.

Patent document 1 discloses a deterioration determination device that calculates an internal resistance based on a current and a voltage of a lead-acid battery, and determines the deterioration based on the internal resistance.

PRIOR ART DOCUMENT

Patent Document

Patent Document 1: JP-A-2016-109639

SUMMARY OF THE INVENTION

Problems to be Solved by the Invention

Main deterioration factors that cause deterioration of a lead-acid battery are: softening of a positive active material; corrosion of a positive electrode grid; sulfation of a negative electrode; and shrinkage of a negative active material. There has been a demand for a means that can satisfactorily estimate the degree of deterioration of a lead-acid battery by estimating the degree of deterioration caused by deterioration factors.

It is an object of the present invention to provide an estimation device, an estimation method, and a computer program for estimating a degree of deterioration of a lead-acid battery.

Means for Solving the Problems

An estimation device according to the present invention includes: a derivation unit configured to derive a derivation history based on a current and a voltage of a lead-acid battery and a temperature of the lead-acid battery; a first specifying unit configured to specify a specific gravity of an electrolyte solution; a second specifying unit configured to specify at least one degree out of: a first degree of softening of a positive electrode material; a second degree of corrosion of a positive electrode grid; a third degree of sulfation of a negative electrode; and a fourth degree of shrinkage of a negative electrode material based on the specified specific gravity, the derived derivation history; and at least one relationship selected from the group consisting of: a first relationship between a first history based on the specific gravity of the electrolyte solution and the current, the voltage and the temperature of the lead-acid battery; and the first degree; a second relationship between a second history based on the specific gravity of the electrolyte solution and the current, the voltage and the temperature of the lead-acid battery, and the second degree; a third relationship between a third history based on the specific gravity of the electrolyte solution and the current, the voltage and the temperature of the lead-acid battery, and the third degree; and a fourth relationship between a fourth history based on the current, the voltage and the temperature of the lead-acid battery, and the fourth degree; and an estimation unit configured to estimate a degree of deterioration of the lead-acid battery based on the specified at least one degree.

An estimation method according to the present invention includes: deriving a derivation history based on a current and a voltage of a lead-acid battery and a temperature of the lead-acid battery; specifying a specific gravity of an electrolyte solution; specifying at least one degree out of: a first degree of softening of a positive electrode material; a second degree of corrosion of a positive electrode grid; a third degree of sulfation of a negative electrode; and a fourth degree of shrinkage of a negative electrode material based on the specified specific gravity, the derived derivation history, and at least one relationship selected from the group consisting of: a first relationship between a first history based on the specific gravity of the electrolyte solution and the current, the voltage and the temperature of the lead-acid battery, and the first degree; a second relationship between a second history based on the specific gravity of the electrolyte solution and the current, the voltage and the temperature of the lead-acid battery, and the second degree; a third relationship between a third history based on the specific gravity of the electrolyte solution and the current, the voltage and the temperature of the lead-acid battery and the third degree; and a fourth relationship between a fourth history based on the current, the voltage and the temperature of the lead-acid battery, and the fourth degree; and estimating a degree of deterioration of the lead-acid battery based on the specified at least one degree.

A computer program according to the present invention is configured to cause a computer to execute processing including: deriving a derivation history based on a current and a voltage of a lead-acid battery and a temperature of the lead-acid battery; specifying a specific gravity of an electrolyte solution; specifying at least one degree out of: a first degree of softening of a positive electrode material; a second degree of corrosion of a positive electrode grid; a third degree of sulfation of a negative electrode; and a fourth degree of shrinkage of a negative electrode material based on the specified specific gravity, the derived derivation history, and at least one relationship selected from the group consisting of: a first relationship between a first history based on the specific gravity of the electrolyte solution and the current, the voltage and the temperature of the lead-acid battery, and the first degree; a second relationship between a second history based on the specific gravity of the electrolyte solution and the current, the voltage and the temperature of the lead-acid battery, and the second degree; a third relationship between a third history based on the specific gravity of the electrolyte solution and the current, the voltage and the temperature of the lead-acid battery, and the third degree; and a fourth relationship between a fourth history based on the current, the voltage and the temperature of the lead-acid battery, and the fourth degree; and estimating a degree of deterioration of the lead-acid battery based on the specified at least one degree.

BRIEF DESCRIPTION OF THE DRAWINGS

FIG. 5 is an explanatory view illustrating one example of a record layout of a degree-of-deterioration database (DB).

FIG. 6 is an explanatory view illustrating an example of a record layout of a use history DB.

FIG. 9 is an explanatory view illustrating one example of a record layout of a use history DB.

MODE FOR CARRYING OUT THE INVENTION

Overall View of this Exemplary Embodiment

Figure 1:
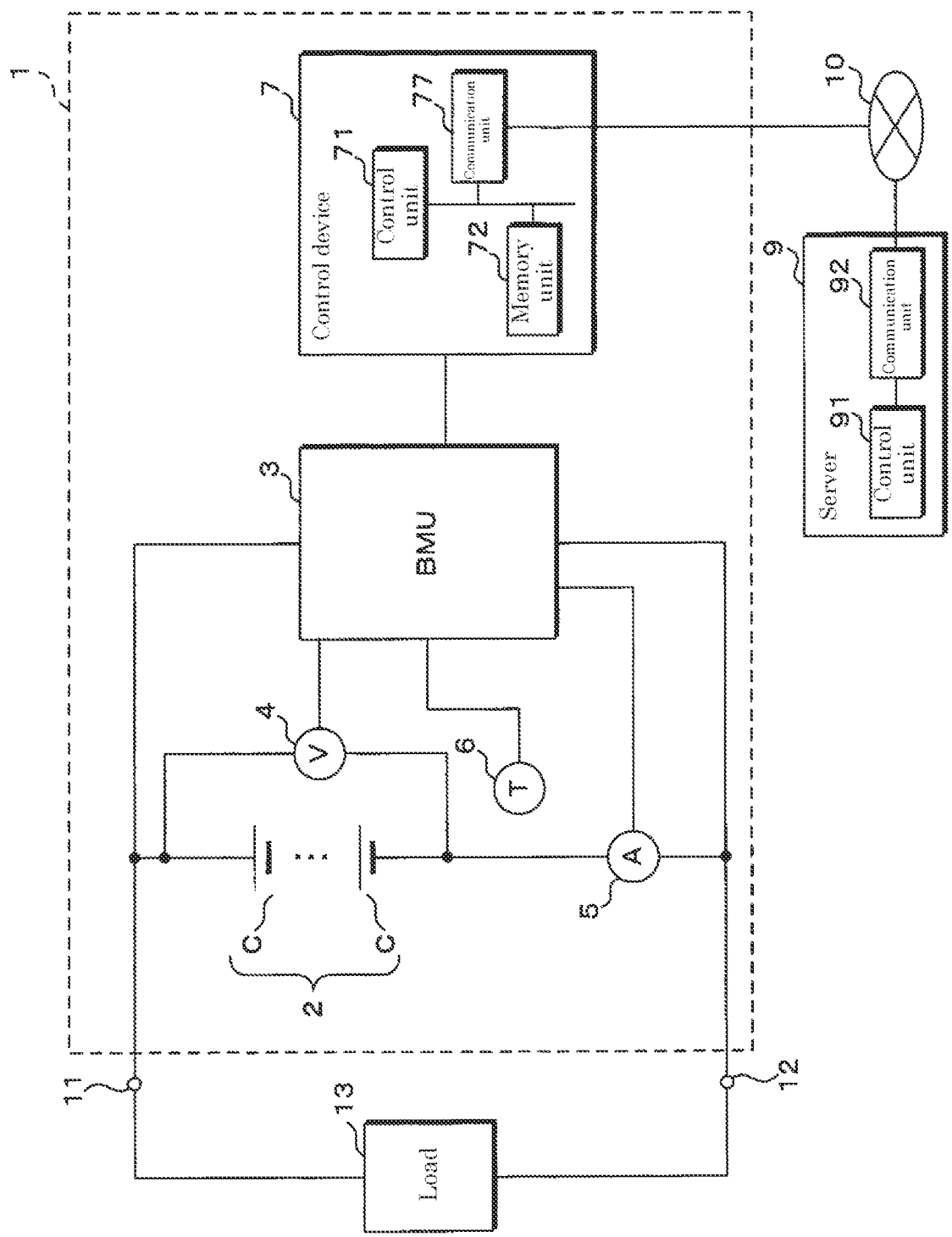
FIG. 1 is a block diagram illustrating a configuration of a charge-discharge system, a load, and a server according to an embodiment 1.

An estimation device according to an embodiment includes: a derivation unit configured to derive a derivation history based on a current and a voltage of a lead-acid battery and a temperature of the lead-acid battery; a first specifying unit configured to specify a specific gravity of an electrolyte solution; a second specifying unit configured to specify at least one degree out of: a first degree of softening of a positive electrode material; a second degree of corrosion of a positive electrode grid; a third degree of sulfation of a negative electrode; and a fourth degree of shrinkage of a negative electrode material based on the specified specific gravity, the derived derivation history, and at least one relationship selected from the group consisting of: a first relationship between a first history based on the specific gravity of the electrolyte solution and the current, the voltage and the temperature of the lead-acid battery, and the first degree; a second relationship between a second history based on the specific gravity of the electrolyte solution and the current, the voltage and the temperature of the lead-acid battery, and the second degree; a third relationship between a third history based on the specific gravity of the electrolyte solution and the current, the voltage and the temperature of the lead-acid battery, and the third degree; and a fourth relationship between a fourth history based on the current, the voltage and the temperature of the lead-acid battery, and the fourth degree; and an estimation unit configured to estimate a degree of deterioration of the lead-acid battery based on the specified at least one degree.

As deterioration factors that cause deterioration of a lead-acid battery, corrosion of a positive electrode grid, softening of a positive electrode material; sulfation of a negative electrode, shrinkage of a negative electrode material and the like are named.

In a lead-acid battery, an amount of water in an electrolyte solution (a sulfuric acid+water) is decreased by evaporation or electrolysis. Accordingly, the concentration of a sulfuric acid is gradually increased and the specific gravity of the electrolyte solution is increased. The higher the specific gravity of the electrolyte solution, the faster a corrosion rate becomes. Therefore, when the specific gravity changes, the accuracy in specifying the degree of corrosion of the positive electrode grid is deteriorated. Accordingly, the accuracy in estimating the deterioration of a lead-acid battery is worsened.

The higher the specific gravity of the electrolyte solution, the more easily the softening of a positive electrode material progresses. Accordingly, when the specific gravity changes, the accuracy in specifying the degree of softening of the positive electrode material is worsened and hence, the accuracy in estimating the deterioration of the lead-acid battery is worsened.

The higher the specific gravity of the electrolyte solution, the lower the charge efficiency becomes. Therefore, with respect to lead sulfate that is generated during discharging, the entirety of lead sulfate is not reduced to lead during charging, and a part of lead sulfate remains as it is. When charging and discharging are repeated, a crystal size of the remaining lead sulfate is gradually increased. In this case, lead sulfate cannot return to lead even when charging is performed so that sulfation of the negative electrode occurs. Therefore, when the specific gravity changes, the accuracy in specifying the degree of sulfation of the negative electrode is worsened. Accordingly, the accuracy in estimating the deterioration of the lead-acid battery is worsened.

A sulfuric acid in the electrolyte solution moves from the electrolyte solution to the negative electrode material by sulfation of the negative electrode. Therefore, as the sulfation of the negative electrode progresses, the concentration of a sulfuric acid in the electrolyte solution is lowered so that the specific gravity of the electrolyte solution is decreased. When the specific gravity is lowered, an action opposite to the action that occurs in the case where the specific gravity is increased occurs. That is, the accuracy in estimating the deterioration of the lead-acid battery is worsened due to a change in the specific gravity.

In view of the above-mentioned circumstances, the inventors of the present application have found that the degree of deterioration of a lead-acid battery can be satisfactorily estimated by specifying the specific gravity of a lead-acid battery and by specifying the degree of softening of the positive electrode material or the like in consideration of a change in the specific gravity.

The specific gravity is specified based on the derivation history at each point of time that the estimation is made. The specific gravity can also be specified by a relational expression of a current and a voltage, or an acquired open circuit voltage (OCV) and an internal resistance. The specific gravity can be specified also by a specific gravity sensor. As the "specified specific gravity", not only the specific gravity at one point at the point of time that the degree of deterioration is estimated but also the stored history of the specific gravity of an electrolyte solution may be used. Alternatively, the average specific gravity obtained by multiplying the stored history of the specific gravity of the electrolyte solution by a predetermined coefficient and averaging the resultant may be used.

When the electrolyte solution is replenished with water, an amount of replenishment water may be estimated based on a change in voltage. When the specific gravity of the electrolyte solution changes, that is, when a rate of water contained in the electrolyte solution changes, a voltage of the battery changes. An amount of the liquid in the battery greatly changes before and after the replenishment of water. Accordingly, the control unit 31 determines that the replenishment of water has been performed when the difference between a voltage acquired this time and a voltage that is acquired one stage before is equal to or more than a predetermined value. The derivation history may include a designated amount of water to be replenished.

In this specification, the first history, the second history, the third history, and the fourth history may be the same or may be different from each other. Parts of these histories may be shared in common. For example, the first history includes histories of a lifetime effective discharge capacity, a temperature cumulative value, a use period and the like. The second history includes histories of a lifetime effective overcharge capacity, a temperature cumulative value, a use period and the like. The third history includes histories of a lifetime effective charge capacity, a temperature cumulative value, a use period, a standing time, a stay time in each state of charge (SOC) section, and the like. The fourth history includes histories of a lifetime effective charge capacity, a temperature cumulative value, a use period and the like.

According to the above-mentioned configuration, the deterioration of the lead-acid battery is estimated using the specified specific gravity in addition to the derivation histories. The deterioration of the lead-acid battery can be satisfactorily estimated by specifying the degree of the softening of the positive electrode material in consideration of a change in the specific gravity.

By predicting the deterioration of the lead-acid battery, a risk of a failure in the lead-acid battery can be estimated and hence, it is possible to avoid the occurrence of a case where the lead-acid battery is suddenly brought into an unusable state.

In the estimation device described above, the first specifying unit may specify the specific gravity of the electrolyte solution by inputting the derived history to a first learning model that is configured to output the specific gravity of the electrolyte solution when a history based on a current and a voltage of the lead-acid battery and a temperature of the lead-acid battery is inputted to the first learning model.

According to the above configuration, the specific gravity of the electrolyte solution can be easily and satisfactorily specified using the first learning model.

In the estimation device described above, the second specifying unit may specify at least one of the first degree, the second degree, the third degree and the fourth degree by inputting the derived derivation history and the specified specific gravity of the electrolyte solution to a second learning model that is configured to output at least one of the first degree, the second degree, the third degree and the fourth degree when the derivation history based on the current, the voltage and the temperature of the lead-acid battery and the specific gravity of the electrolyte solution are inputted to the second learning model.

According to the above configuration, the degree of deterioration factor at a point of time of estimation can be easily and satisfactorily specified using the second learning model.

In the estimation device described above, the estimation unit may estimate the degree of deterioration of the lead-acid battery by inputting the specified at least one degree to a third learning model that is configured to output the degree of deterioration of the lead-acid battery when at least one of the first degree, the second degree, the third degree and the fourth degree is inputted to the third learning model.

According to the above configuration, the deterioration of the lead-acid battery at a point of time of estimation can be easily and satisfactorily estimated using the third learning model.

In the estimation device described above, the derivation history may include: an effective discharge capacity obtained by correcting a discharge capacity with a coefficient based on at least one of the temperature and the specific gravity of the electrolyte solution; an effective charge capacity obtained by correcting a charge capacity with a coefficient based on at least one of the temperature and the specific gravity of the electrolyte solution; or a temperature cumulative value obtained by integration by multiplying the temperature by a predetermined coefficient or a coefficient based on the specific gravity of the electrolyte solution.

According to the above configuration, the degree of the deterioration factor can be satisfactorily specified. The degree of deterioration factor can be specified using an effective discharge capacity or the like corrected by the specific gravity.

In the estimation device described above, the second specifying unit may specify the at least one degree based on the derivation history and the design information of the lead-acid battery.

According to the above configuration, the degree of deterioration factor can be satisfactorily specified based on the derivation history and the design information.

In the estimation device described above, the design information may be at least one selected from the group consisting of the number of plates, an amount of a positive active material, a mass of the positive electrode grid, a thickness of the positive electrode grid, a design of the positive electrode grid, a density of the positive electrode material, the composition of the positive electrode material, an amount and a kind of an additive in the positive electrode material, the composition of a positive electrode alloy, the presence or absence, a thickness, a material and gas permeability of a nonwoven fabric that is brought into contact with a positive electrode plate, an amount of a negative active material, an amount and a kind of carbon in the negative electrode material, an amount and a kind of an additive in the negative active material, a specific surface area of the negative electrode material, a kind and a concentration of an additive in the electrolyte solution, and an initial specific gravity and an initial amount of the electrolyte solution.

According to the above configuration, the degree of the deterioration factor can be satisfactorily specified.

In the estimation device described above, the estimation unit may estimate the degree of deterioration based on the at least one degree and the diagnosis information of the lead-acid battery.

According to the above configuration, the degree of deterioration factor can be satisfactorily estimated based on the degree of the deterioration factor and the diagnosis information.

In the estimation device described above, the diagnosis information may be at least one selected from the group consisting of an internal resistance, an open circuit voltage (OCV), and a state of charge (SOC).

According to the above configuration, the degree of the deterioration factor can be satisfactorily specified.

The estimation device described above may include: a memory unit that stores the derivation history, and the degree of deterioration specified by the second specifying unit or the diagnosis information; and a history erasing unit that erases the derivation history, the degree of deterioration or the diagnosis information when the estimation unit estimates that the lead-acid battery has been exchanged based on the degree of deterioration or the diagnosis information, and a threshold value.

When it is determined that the lead-acid battery has been exchanged based on the degree of deterioration or the diagnosis information, for example, data of the use history DB described later can be erased.

An estimation method according this exemplary embodiment includes: deriving a derivation history based on a current and a voltage of a lead-acid battery and a temperature of the lead-acid battery; specifying a specific gravity of an electrolyte solution; specifying at least one degree out of: a first degree of softening of a positive electrode material; a second degree of corrosion of a positive electrode grid; a third degree of sulfation of a negative electrode; and a fourth degree of shrinkage of a negative electrode material based on the specified specific gravity, the derived derivation history, and at least one relationship selected from the group consisting of: a first relationship between a first history based on the specific gravity of the electrolyte solution and the current, the voltage and the temperature of the lead-acid battery, and the first degree; a second relationship between a second history based on the specific gravity of the electrolyte solution and the current, the voltage and the temperature of the lead-acid battery, and the second degree; a third relationship between a third history based on the specific gravity of the electrolyte solution and the current, the voltage and the temperature of the lead-acid battery, and the third degree; and a fourth relationship between a fourth history based on the current, the voltage and the temperature of the lead-acid battery, and the fourth degree; and estimating a degree of deterioration of the lead-acid battery based on the specified at least one degree.

According to the above-mentioned configuration, the deterioration of the lead-acid battery is estimated using the specific gravity in addition to the derivation histories. The deterioration of the lead-acid battery can be satisfactorily estimated in consideration of a change in the specific gravity. As the specific gravity, as described above, it is possible to use the specific gravity specified by the history of the overcharge capacity or the like at a point of time of estimation of the degree of deterioration, the specific gravity acquired by a specific gravity sensor, the history of a stored specific gravity or the like.

A computer program according to this exemplary embodiment causes a computer to execute processing including: deriving a derivation history based on a current and a voltage of a lead-acid battery and a temperature of the lead-acid battery; specifying a specific gravity of an electrolyte solution; specifying at least one degree out of: a first degree of softening of a positive electrode material; a second degree of corrosion of a positive electrode grid; a third degree of sulfation of a negative electrode; and a fourth degree of shrinkage of a negative electrode material based on the specified specific gravity, the derived derivation history, and at least one relationship selected from the group consisting of: a first relationship between a first history based on the specific gravity of the electrolyte solution and the current, the voltage and the temperature of the lead-acid battery, and the first degree; a second relationship between a second history based on the specific gravity of the electrolyte solution and the current, the voltage and the temperature of the lead-acid battery, and the second degree; a third relationship between a third history based on the specific gravity of the electrolyte solution and the current, the voltage and the temperature of the lead-acid battery, and the third degree; and a fourth relationship between a fourth history based on the current, the voltage and the temperature of the lead-acid battery, and the fourth degree; and estimating a degree of deterioration of the lead-acid battery based on the specified at least one degree.

Embodiment 1

Figure 2:
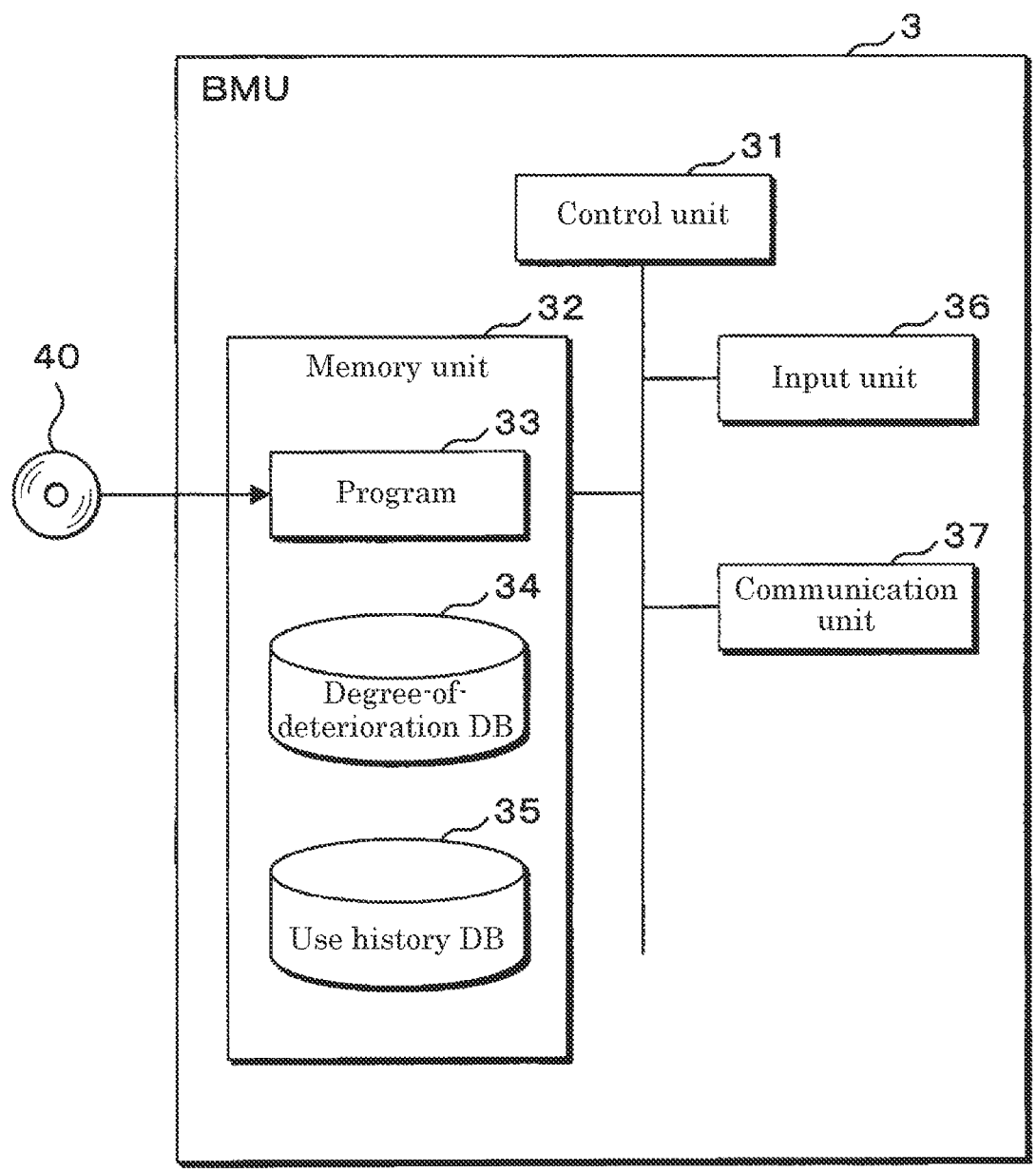
FIG. 2 is a block diagram illustrating the configuration of a battery management unit (BMU).

FIG. 1 is a block diagram illustrating the configuration of a charge-discharge system 1, a load 13, and a server 9 according to an embodiment 1. FIG. 2 is a block diagram illustrating the configuration of a battery management unit (BMU) 3.

The charge-discharge system 1 includes a lead-acid battery (hereinafter, referred to as a battery) 2, the BMU 3, a voltage sensor 4, a current sensor 5, a temperature sensor 6, and a control device 7.

The BMU 3 includes a control unit 31, a memory unit 32, an input unit 36, and a communication unit 37. The BMU 3 may be a battery electronic control unit (ECU).

The control device 7 controls the entire charge-discharge system 1, and includes a control unit 71, a memory unit 72, and a communication unit 77.

The server 9 includes a control unit 91 and a communication unit 92.

The control unit 71 of the control device 7 is connected to the control unit 91 via communication unit 77, a network 10, and the communication unit 92.

The battery 2 is connected to the load 13 via terminals 11 and 12.

The control units 31, 71, and 91 each include, for example, a central processing unit (CPU), a read only memory (ROM), a random access memory (RAM), and the like, and control the operations of the BMU 3, the control device 7, and the server 9.

The memory unit 32 and the memory unit 72 are each formed of, for example, a hard disk drive (HDD) or the like, and each store various programs and data.

The communication units 37, 77, and 92 each have a function of communicating with other devices via a network, and each can transmit and receive desired information.

The memory unit 32 of the BMU 3 stores a program 33 for deterioration estimation. The program 33 is provided in a state where the program 33 is stored in a computer-readable recording medium 40 such as a CD-ROM, a DVD-ROM, or a USB memory, for example. The program 33 is stored in the memory unit 32 in a state where the program 33 is installed in the BMU 3. Further, the program 33 may be acquired from an external computer (not illustrated) that is connected to a communication network, and may be stored in the memory unit 32.

The memory unit 32 also stores a degree-of-deterioration DB 34 and a use history DB 35. The degree-of-deterioration DB 34 stores a history, a specific gravity of an electrolyte solution, design information, diagnosis information, degrees of respective deterioration factors, and the degree of deterioration of the battery 2. The use history DB 35 stores a derivation history, a specific gravity of an electrolyte solution, design information, diagnosis information, degree of respective deterioration factors, and a degree of deterioration for each battery 2. Details of the degree-of-deterioration DB 34 and the use history DB 35 will be described later.

The input unit 36 receives inputting of detection results from the voltage sensor 4, the current sensor 5, and the temperature sensor 6.

In this exemplary embodiment, the BMU3 functions as the estimation device according to the present invention. Either the control device 7 or the server 9 may function as the estimation device. Even when the BMU 3 functions as the estimation device, it is not always necessary that the memory unit 32 includes all of the program 33, the degree-of-deterioration DB 34, and the use history DB 35. Depending on this exemplary embodiment, any or all of the program 33, the degree-of-deterioration DB 34, and the use history DB 35 may be stored in the control device 7 or may be stored in the server 9. When the server 9 does not function as the estimation device, the charge-discharge system it may not be connected to the server 9.

The voltage sensor 4 is connected in parallel to the battery 2, and outputs a detection result corresponding to the entire voltage of the battery 2.

The current sensor 5 is connected in series with the battery 2, and outputs a detection result corresponding to a current of the battery 2. As the current sensor 5, for example, a current sensor such as a clamp current sensor that is not electrically connected to the battery 2 can be also used.

The temperature sensor 6 is disposed in the vicinity of the battery 2, and outputs a detection result corresponding to a temperature of the battery 2. In predicting the deterioration, it is preferable to use a temperature of an electrolyte solution of the battery 2 as a temperature of the battery 2. Therefore, the temperature correction may be performed such that the temperature detected by the temperature sensor 6 becomes the temperature of the electrolyte solution corresponding to the position where the temperature sensor 6 is disposed.

Figure 3:
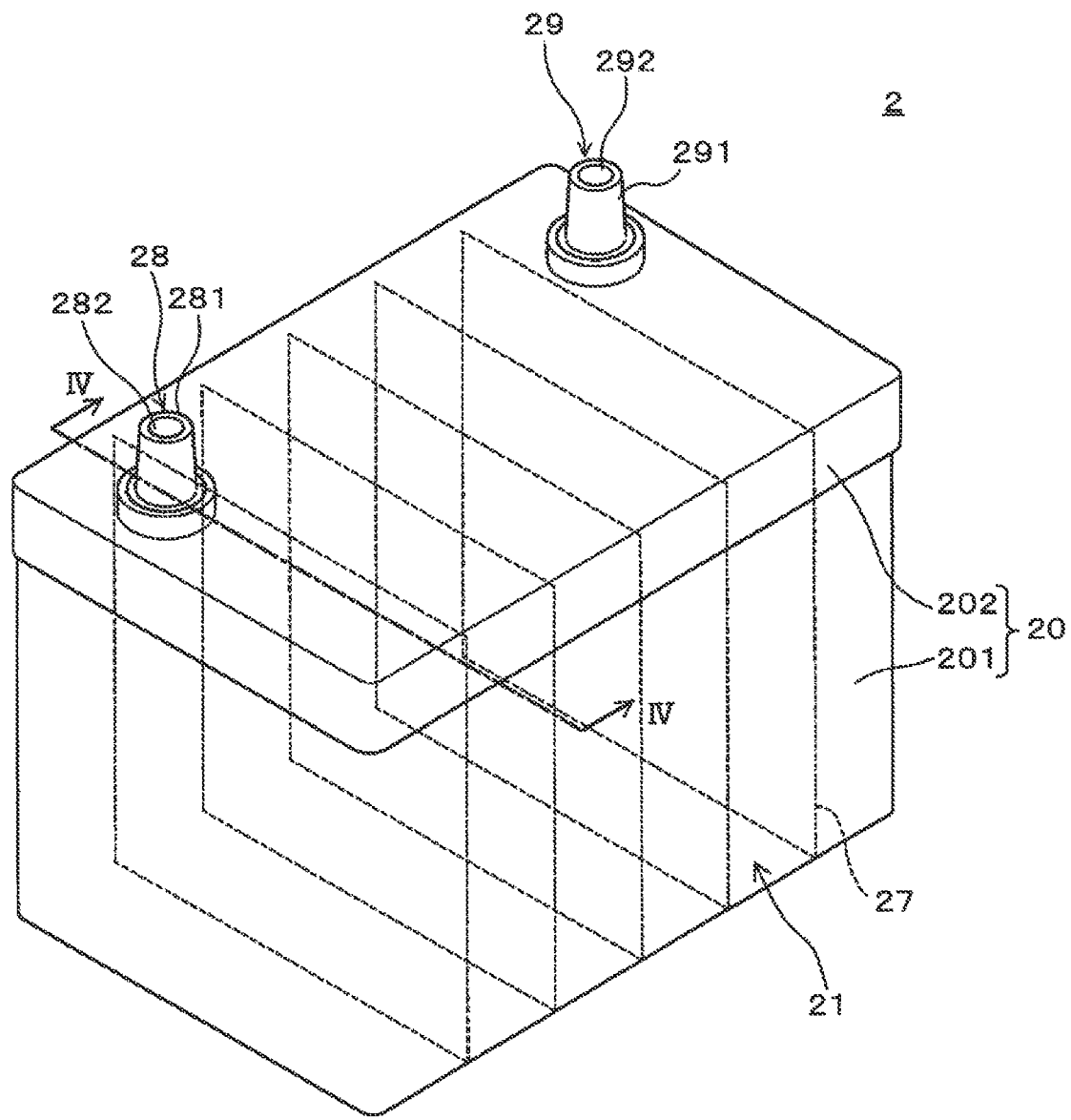
FIG. 3 is a perspective view illustrating an external appearance configuration of a battery.
Figure 4:
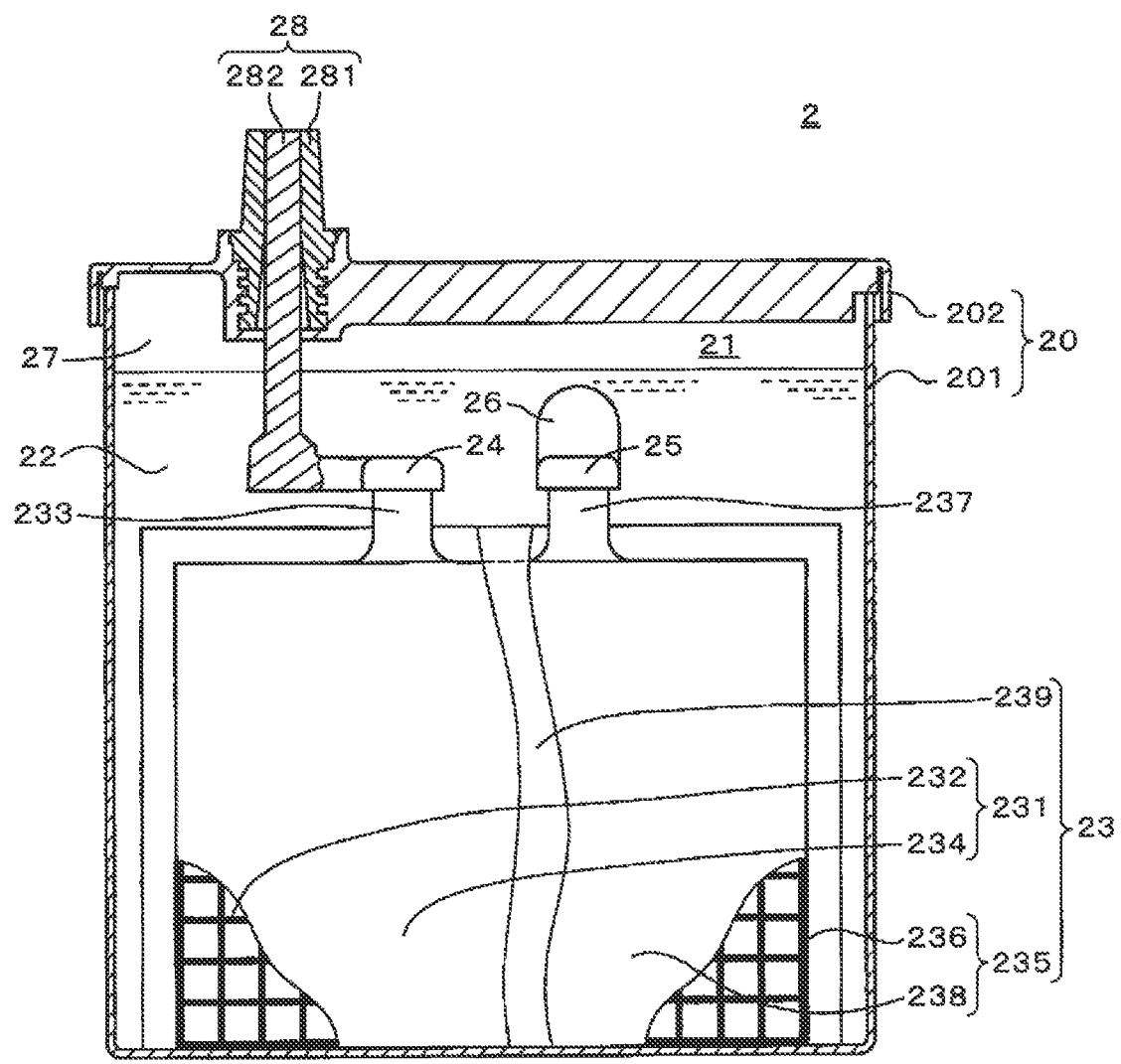
FIG. 4 is a cross-sectional view of the battery in FIG. 3 taken along line IV-IV.

FIG. 3 is a perspective view illustrating an external appearance configuration of the battery 2 that is a liquid type battery for an automobile as an example, and FIG. 4 is a cross-sectional view of the battery 2 in FIG. 3 taken along line IV-IV.

As illustrated in FIG. 3 and FIG. 4, the battery 2 includes a container 20, a positive electrode terminal 28, a negative electrode terminal 29, and a plurality of elements 23.

The container 20 includes a container body 201 and a lid 202. The container body 201 is a rectangular parallelepiped container whose upper portion is opened. The container body 201 and is made of, for example, a synthetic resin or the like. For example, the lid 202 made of a synthetic resin closes the opening portion of the container body 201. A peripheral edge portion of a lower surface of the lid 202 and a peripheral edge portion of the opening portion of the container body 201 are joined to each other by thermal welding, for example. A space in the container 20 is partitioned, by partition walls 27, into a plurality of cell chambers 21 arranged in the longitudinal direction of the container 20.

One element 23 is accommodated in each cell chamber 21 in the container 20. An electrolyte solution 22 that contains a dilute sulfuric acid is accommodated in each cell chamber 21 in the container 20, and the entire element 23 is immersed in the electrolyte solution 22. The electrolyte solution 22 is filled into the cell chamber 21 from an electrolyte solution filling port (not illustrated) formed in the lid 202.

The element 23 includes a plurality of positive electrode plates 231, a plurality of negative electrode plates 235, and separators 239. The plurality of positive electrode plates 231 and the plurality of negative electrode plates 235 are alternately arranged.

The positive electrode plate 231 includes: a positive electrode grid 232; and a positive electrode material 234 supported by the positive electrode grid 232. The positive electrode grid 232 is a conductive member having skeleton portions arranged substantially in a grid shape or in a mesh shape. The positive electrode grid 232 is made of, for example, lead or a lead alloy. The positive electrode grid 232 has an ear 233 that protrudes upward in the vicinity of an upper end of the positive electrode grid 232. The positive electrode material 234 contains a negative active material (lead dioxide or lead sulfate) that generates capacity by an oxidation-reduction reaction. The positive electrode material 234 may further contain a known additive.

The negative electrode plate 235 includes: a negative electrode grid 236; and a negative electrode material 238 supported by the negative electrode grid 236. The negative electrode grid 236 is a conductive member having skeleton portions arranged substantially in a grid shape or in a mesh shape. The negative electrode grid 236 is made of, for example, lead or a lead alloy. The negative electrode grid 236 has an ear 237 that protrudes upward in the vicinity of an upper end of the negative electrode grid 236. The negative electrode material 238 contains a negative active material (lead or lead sulfate) that generates capacity by an oxidation-reduction reaction. The negative electrode material 238 may further contain a known additive.

The separator 239 is made of, for example, an insulating material such as glass or a synthetic resin. The separator 239 is interposed between the positive electrode plate 231 and the negative electrode plate 235 disposed adjacently to each other. The separators 239 may be formed as an integral member or each of the separators 239 may be interposed between the positive electrode plate 231 and the negative electrode plate 235. The separator 239 may be disposed so as to wrap either the positive electrode plate 231 or the negative electrode plate 235.

The ears 233 of the plurality of positive electrode plates 231 are connected to a strap 24 made of, for example, lead or a lead alloy. The plurality of positive electrode plates 231 are electrically connected to each other via strap 24. In the same manner as described above, the ears 237 of the plurality of negative electrode plates 235 are connected to a strap 25 made of, for example, lead or a lead alloy. The plurality of negative electrode plates 235 are electrically connected to each other via strap 25.

In the battery 2, the strap 25 in one cell chamber 21 is connected to the strap 24 in another cell chamber 21 disposed adjacently to the one cell chamber 21 via an intermediate pole 26. The intermediate pole 26 is made of, for example, lead or a lead alloy. The strap 24 in one cell chamber 21 is connected to the strap 25 in another cell chamber 21 disposed adjacently to the one cell chamber 21 via intermediate pole 26. That is, the plurality of elements 23 of the battery 2 are electrically connected to each other in series via straps 24, 25 and the intermediate pole 26. As illustrated in FIG. 4, the strap 24 accommodated in the cell chamber 21 located at one end in the direction that the cells C are arranged is connected not to the intermediate pole 26 but to a positive electrode pole 282 described later. The strap 25 accommodated in the cell chamber 21 located at the other end in the direction that the cells C are arranged is connected not to the intermediate pole 26 but to a negative pole 292 (not illustrated).

The positive electrode terminal 28 is disposed at one end portion in the direction that the cells C are arranged, and the negative electrode terminal 29 is disposed in the vicinity of the other end portion in the direction that the cells C are arranged.

As illustrated in FIG. 4, the positive electrode terminal 28 includes a bushing 281 and a positive electrode pole 282. The bushing 281 is a substantially cylindrical conductive member, and is made of, for example, a lead alloy. A lower portion of the bushing 281 is integrally formed with the lid 202 by insert molding, and an upper portion of the bushing 281 protrudes upward from an upper surface of the lid 202. The positive electrode pole 282 is a substantially cylindrical conductive member. The positive electrode pole 282 is made of, for example, a lead alloy. The positive electrode pole 282 is inserted into a hole formed in the bushing 281. An upper end portion of the positive electrode pole 282 is located at substantially the same position as an upper end portion of the bushing 281, and is joined to the bushing 281 by welding, for example. A lower end portion of the positive electrode pole 282 protrudes downward from a lower end portion of the bushing 281, and further protrudes downward from a lower surface of the lid 202. The lower end portion of the positive electrode pole 282 is connected to the strap 24 accommodated in the cell chamber 21 located at one end portion in the direction that the cells C are arranged.

The negative electrode terminal 29 has substantially the same configuration in the same manner as the positive electrode terminal 28 (see FIG. 3). The negative electrode terminal 29 includes a bushing 291 and a negative pole 292.

In discharging the battery 2, a load (not illustrated) is connected to the bushing 281 of the positive electrode terminal 28 and the bushing 291 of the negative electrode terminal 29. Electricity generated by a reaction in the positive electrode plate 231 of each element 23 (a reaction in which lead sulfate is generated from lead dioxide) and a reaction in the negative electrode plate 235 of each element 23 (a reaction in which lead sulfate is generated from lead (spongy lead)) is supplied to the load. In charging the battery 2, a power source (not illustrated) is connected to the bushing 281 of the positive electrode terminal 28 and the bushing 291 of the negative electrode terminal 29. Accordingly, with the supply of electricity from the power source, a reaction in the positive electrode plate 231 of each element 23 (a reaction in which lead dioxide is generated from lead sulfate) and a reaction in the negative electrode plate 235 of each element 23 (a reaction in which lead (spongy lead) is generated from lead sulfate) are generated so that the battery 2 is charged with electricity.

FIG. 5 is an explanatory view illustrating one example of a record layout of the above-mentioned degree-of-deterioration database (DB) 34.

The degree-of-deterioration DB 34 stores: history columns such as a number column, a lifetime effective discharge capacity column, a lifetime effective charge capacity column, a lifetime effective overcharge capacity column, a temperature cumulative value column, a standing time column, and an SOC stay time column; a specific gravity column; a positive electrode grid thickness column; a diagnosis information column; deterioration factor degree columns such as a first degree column, a second degree column, a third degree column, and a fourth degree column; and a degree-of-deterioration column.

The number column stores: the numbers of the degrees of deteriorations of a plurality of different batteries 2; and the numbers of the degrees of deteriorations of the same battery 2 at different timings. The lifetime effective discharge capacity column stores, for example, a cumulative value of effective discharge capacity obtained by measuring discharge capacity of the battery 2 for every 1 minute and by multiplying the measured discharge capacities by coefficients based on the temperatures of the battery 2 at the respective points of time. The lifetime effective charge capacity column stores, for example, a cumulative value of effective charge capacity obtained by measuring charge capacity of the battery 2 for every 1 minute and by multiplying the measured charge capacities by coefficients based on the temperatures of the battery 2 at the respective points of time. The lifetime effective overcharge capacity column stores a cumulative value of the effective overcharge capacities obtained by subtracting the effective discharge capacities from the effective charge capacities.

The temperature cumulative value column stores, for example, a cumulative value obtained by multiplying a center temperature in each temperature interval by predetermined coefficients and time at a temperature interval of 10° C. from −20° C. to 80° C.

The standing time stores a cumulative value of parking times,

The SOC stay time column stores a stay time with an SOC of 0 to 20%, a stay time with an SOC of 20 to 40%, a stay time with an SOC of 40 to 60%, a stay time with an SOC of 60 to 80%, a stay time with an SOC of 80 to 100%, and the like. With respect to the stay time with an SOC of 0 to 20%, for example, the degree-of-deterioration DB 34 obtains an average SOC at a unit time of 1 hour, and stores a cumulative value of times during which the average SOC falls within a range of 0 to 20%. In the same manner as described above, with respect to the stay time with an SOC of 20 to 40%, the stay time with an SOC of 40 to 60%, the stay time with an SOC of 60 to 80% and the stay time with an SOC of 80 to 100%, the degree-of-deterioration DB 34 stores a cumulative value of times during which the average SOC falls within a range of 20 to 40%, a cumulative value of times during which the average SOC falls within a range of 40 to 60%, a cumulative value of times during which the average SOC falls within a range of 60 to 80%, and a cumulative value of times during which the average SOC falls within a range of 80 to 100%.

The diagnosis information column stores diagnosis information such as internal resistances, SOCs, and OCVs.

The specific gravity column stores a history of the specific gravity of an electrolyte solution, for example, average specific gravities.

The first degree column stores a first degree which is a degree of softening of the positive electrode material. The first degree is expressed by numerical values in six grades from 0 to 5. The evaluation is performed based on a removal amount of the positive electrode material by softening, the degree of softening of the positive electrode material and the like. The numerical value "0" expresses that the evaluation is favorable, and the evaluation is worsened as the numerical value is increased.

The second degree column stores a second degree that is a degree of corrosion of the positive electrode grid. The second degree is expressed by numerical values in six grades. The evaluation is expressed substantially by the same numerical values as described above. The evaluation is performed based on a mass of the positive electrode grid that is decreased by corrosion, a mass of the remaining positive electrode grid, or the like.

The third degree column stores a third degree that is a degree of sulfation of the negative electrode. The third degree is expressed by numerical values in six grades. The evaluation is expressed substantially by the same numerical values as described above. The evaluation is performed based on an amount of lead sulfate in the negative active material.

The fourth degree column stores a fourth degree that is a degree of shrinkage of the negative electrode material. The fourth degree is expressed by the evaluation in six grades. The evaluation is expressed substantially by the same numerical values as described above. The evaluation is performed based on a degree of occurrence of cracks due to shrinkage of the electrode material, a degree of lowering of a specific surface area, and the like.

The evaluation of the first degree, the evaluation of the second degree, the evaluation of the third degree, and the evaluation of the fourth degree are not limited to the case where each evaluation is made in six grades, and each evaluation may be made in hundred grades. Alternatively, each evaluation may be made based on values of physical quantities associated with respective degrees.

The degree-of-deterioration column stores the degree of deterioration expressed by evaluation in ten grades. The numerical values of 1 to 10 that express the degree of deterioration are determined based on a range of a state of health (SOH). In a case where the following rate is determined as the SOH, the numerical value "1" expresses that the SOH falls within a range of 90 to 100%, and the numerical value "10" expresses that the SOH falls within a range of 0 to 10%. The SOH can be set based on a characteristic that the lead-acid battery is expected to possess. For example, using a usable period as the reference, the rate of the remaining usable period at a point of time that the evaluation is made may be set as the SOH. Alternatively, using a voltage during the normal-temperature high-rate discharging as the reference, the voltage during the normal-temperature high-rate discharging at a point of time that the evaluation is made may be used for the evaluation of the SOH. In both cases, when the SOH is 0, such a case indicates a state where a function of the lead-acid battery is lost.

The information stored in the degree-of-deterioration DB 34 is not limited to the above-mentioned information.

The degree-of-deterioration DB 34 may store, as design information, besides a thickness of the positive electrode grid, the number of plates, an amount of a positive active material, a mass of a positive electrode grid, a design of the positive electrode grid, a density of the positive electrode material, the composition of the positive electrode material, an amount and a type of an additive in the positive electrode material, the composition of a positive electrode alloy, the presence or absence of a nonwoven fabric that is brought into contact with the positive electrode plate, a thickness, a material and gas permeability of the nonwoven fabric, an amount of a negative active material, an amount and a type of carbon in the negative electrode material, an amount and a type of an additive in the negative electrode material, a specific surface area of the negative electrode material, a type and concentration of an additive in an electrolyte solution, and an initial specific gravity and an initial amount of the electrolyte solution.

An internal resistance, an open circuit voltage, or the like may be stored as the diagnosis information. Since the internal resistance and the open circuit voltage depend on the SOC, the internal resistance and the open circuit voltage may be corrected by a separately obtained SOC.

FIG. 6 is an explanatory view illustrating one example of a record layout of the above-mentioned use history DB 35.

The use history DB 35 stores, for each battery 2, a derivation history at each point of time of estimation, a specific gravity of an electrolyte solution, a thickness of a positive electrode grid, diagnosis information, degree of deterioration factors, and a degree of deterioration. FIG. 6 illustrates a derivation history of the battery 2 having the identification number 1. The number column stores the number at each point of time of estimation. The derivation history column, the positive electrode grid thickness column, and the diagnosis information column store substantially the same contents as the history column, the positive electrode grid thickness column, and the diagnosis information column of the degree-of-deterioration DB 34.

As described later, the gravity column stores a history of the specific gravities specified by the derivation histories based on the currents, the voltages, and the temperatures at the respective points of time of estimation. As described above, the specific gravity can also be specified by a relational expression of a current and a voltage, or an acquired OCV and internal resistance. The specific gravity can also be specified by a specific gravity sensor.

As will be described later, the first degree column, the second degree column, and the third degree column store a first degree, a second degree, and a third degree specified based on the specific gravity of the electrolyte solution and the derivation history at each point of time of estimation. As will be described later, the fourth degree column stores the fourth degree specified based on the derivation history at each point of time of estimation.

The degree-of-deterioration column stores the degree of deterioration estimated based on the first degree, the second degree, the third degree, and the fourth degree as specified above.

The information stored in the use history DB 35 is not limited to the above-mentioned information.

Hereinafter, a method of estimating the degree of deterioration will be described.

Figure 7:
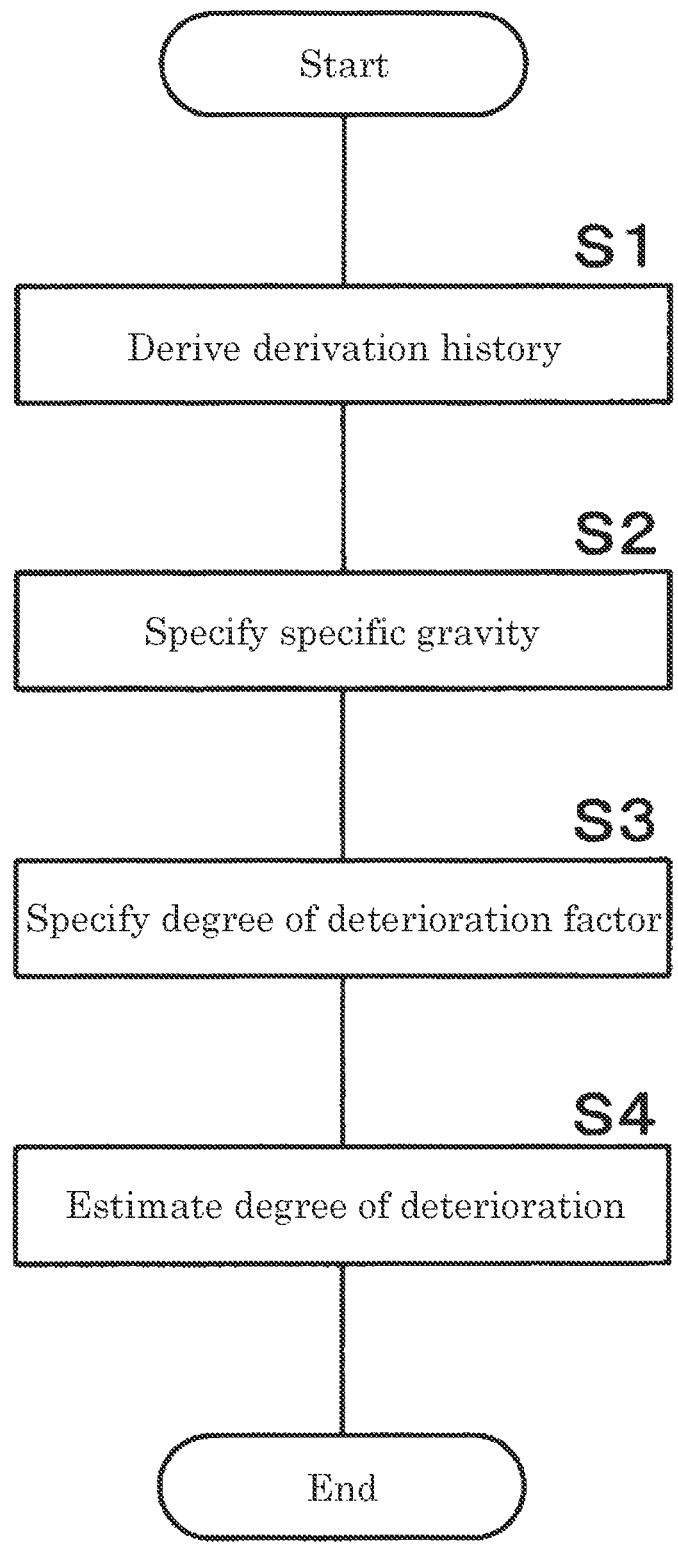
FIG. 7 is a flowchart illustrating steps of processing for estimating the degree of deterioration by a control unit.

FIG. 7 is a flowchart illustrating steps of processing for estimating the degree of deterioration by a control unit 31. The control unit 31 performs the following processing at a predetermined point of time of estimation.

The control unit 31 derives, with respect to the battery 2 having the identification number 1, a derivation histories of the lifetime effective discharge capacity and the like based on a voltage, a current, and a temperature acquired at each point of time of estimation, and stores the derivation history in the use history DB 35 (S1).

The control unit 31 specifies the specific gravity of the electrolyte solution (S2). The control unit 31 reads the degree-of-deterioration DB 34, specifies the specific gravity based on the relationship between the derivation history and the specific gravity derived from the data of the degree-of-deterioration DB 34, and stores the specific gravity in the use history DB 35.

The specific gravity of the electrolyte solution can be specified as follows, for example.
(1) An initial specific gravity of an electrolyte solution is stored in the use history DB 35 as design information. Alternatively, the initial specific gravity of the electrolyte solution is estimated based on a battery voltage when the SOC is 100% (a voltage when the voltage becomes stable after a lapse of a little time from charging), and the initial specific gravity of the electrolyte solution is stored in the specific gravity column.

(2) An amount of overcharge capacity a is calculated based on the charge-discharge history during an estimation period.

(3) An amount of self discharge capacity of the battery 2 is estimated based on a temperature during the estimation period.

(4) An amount of overcharge capacity b is calculated based on the following expression.

> an amount of overcharge capacity $b$=an amount of overcharge capacity $a$−an amount of self discharge capacity−an amount of discharge capacity due to a dark current (5) An amount of water splitting reaction is calculated based on an amount of overcharge capacity b, and a decreased amount of an electrolyte solution is estimated.

(6) The specific gravity of the electrolyte solution at a point of time of estimation is estimated based on the decreased amount of the electrolyte solution and the specific gravity of the electrolyte solution.

The control unit 31 reads the degree-of-deterioration DB 34. Then, the control unit 31 specifies a first degree based on a first relationship between the specific gravity of the electrolyte solution and the first history and the first degree that is derived from data of the degree-of-deterioration DB 34, and stores the first degree in the use history DB 35 (S3). In the same manner as described above, the control unit 31 specifies a second degree based on a second relationship between the specific gravity of the electrolyte solution and the second history and the second degree that is derived from data of the degree-of-deterioration DB 34. The control unit 31 specifies a third degree based on a third relationship between the specific gravity of the electrolyte solution and the third history and the third degree that is derived from data of the degree-of-deterioration DB 34. The control unit 31 specifies a fourth degree based on a fourth relationship between the fourth history and the fourth degree that is derived from data of the degree-of-deterioration DB 34. Then, the first to fourth degrees are stored in the use history DB 35.

The specific gravity of the electrolyte solution used for specifying the first degree to the fourth degree by the control unit 31 may be the specific gravity of the electrolyte solution at a point of time of estimation. A stored history of the specific gravity of the electrolyte solution may be used. Further, an average specific gravity that is obtained by multiplying the stored history of the specific gravities of the electrolyte solution by predetermined coefficients and by averaging the results obtained by multiplication may be used.

Further, the control unit 31 may use the derivation history based on a current, a voltage, and a temperature for specifying the first degree to the fourth degree after correcting the derivation history with the specific gravity of the electrolyte solution.

The control unit 31 estimates the deterioration factor from the degree of the specified deterioration factor based on a relationship between the first degree, the second degree, the third degree and the fourth degree and the degree of deterioration that is derived from data of the degree-of-deterioration DB 34. Then, the control unit 31 stores the estimated degree of deterioration in the use history DB 35 (S4), and finishes the processing.

When the design information is also stored in the degree-of-deterioration DB 34, in S3, the control unit 31 specifies the first degree based on the first relationship between the specific gravity of the electrolyte solution, the first history, the design information, and the first degree. The control unit 31 also specifies the second degree based on the relationship between the specific gravity of the electrolyte solution, the second history, the design information, and the second degree, and specifies the third degree based on the relationship between the specific gravity of the electrolyte solution, the third history, the design information, and the third degree. The control unit 31 specifies the fourth degree based on the relationship between the fourth history, the design information, and the fourth degree.

When diagnosis information is also stored in the degree-of-deterioration DB 34, the degree of deterioration may be corrected by the diagnosis information in S4.

In this exemplary embodiment, the case is described where all of the first degree, the second degree, the third degree, and the fourth degree are specified, and the deterioration degree is estimated using these degrees. However, the present invention is not limited to such a case. It is sufficient that at least one of the first degree, the second degree, the third degree, and the fourth degree is specified, and the degree of deterioration is estimated using the specified degrees.

The degree-of-deterioration DB 34 may store functions of the first relationship, the second relationship, the third relationship, and the fourth relationship.

When the control unit 31 determines that battery 2 has been exchanged based on the estimated degree of deterioration or diagnosis information and a preset threshold value, the control unit 31 may erase and reset data of the use history DB 35. When the control unit 31 determines that the battery 2 has been exchanged, the control unit 31 may perform operations other than resetting the data of the use history DB. That is, when the control unit 31 determines that the battery 2 has been exchanged, the control unit 31 may set a point of time that the cumulation of history information that is stored in the use history DB is started as a point of time that the battery 2 is exchanged.

According to this exemplary embodiment, the derivation history based on the current, the voltage, and the temperature is derived, the specific gravity of the electrolyte solution is specified, and the first degree, the second degree or the third degree is specified based on the relationship between the specific gravity of the electrolyte solution and the derivation history that are obtained preliminarily, and the degree of the deterioration factor. The fourth degree is specified based on the relationship between the derivation history and the fourth relationship. The deterioration of the battery 2 can be satisfactorily estimated by satisfactorily specifying the degree of softening of the positive active material or the like also in consideration of a change in the specific gravity.

EMBODIMENT 2

Figure 8:
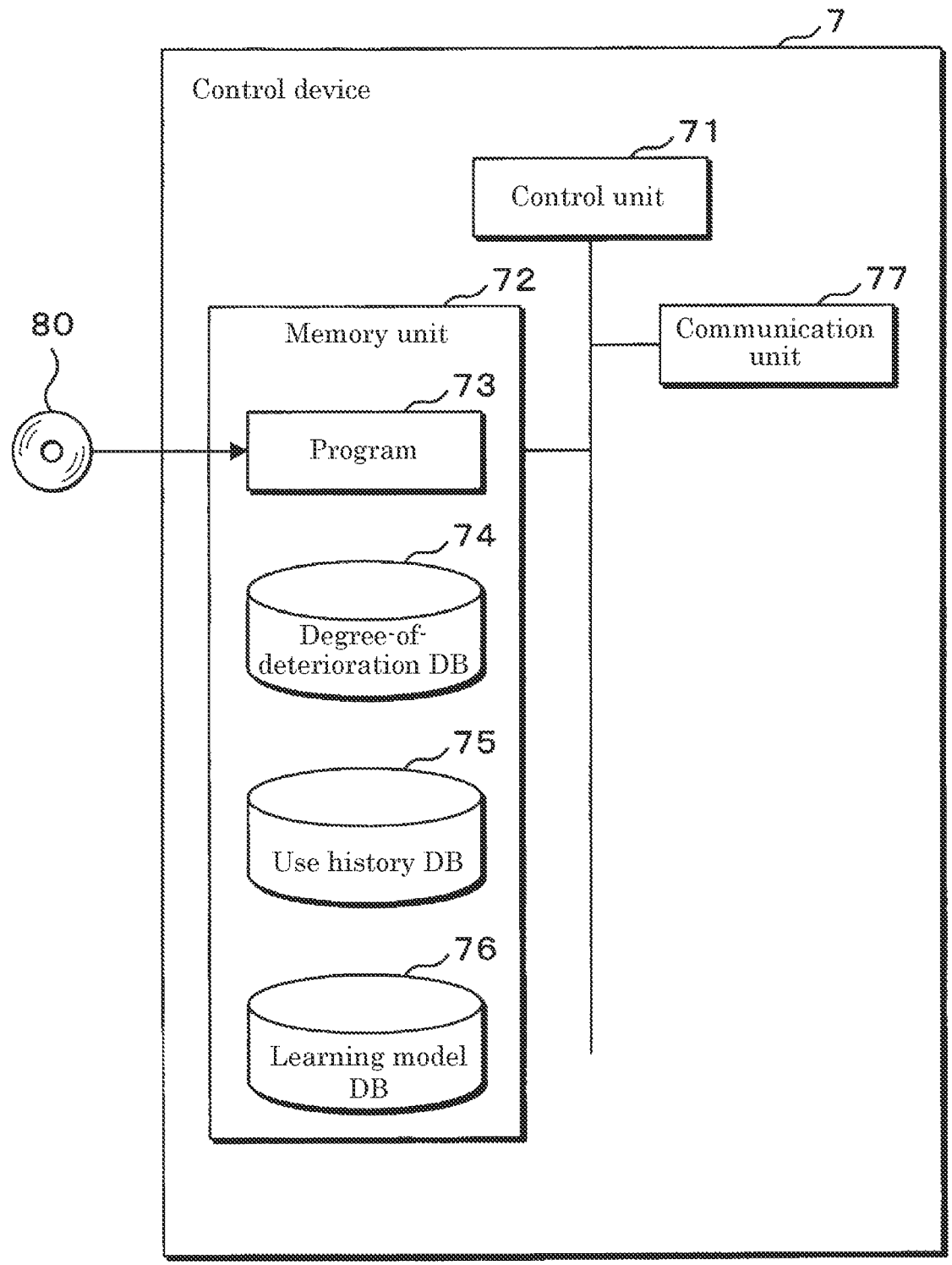
FIG. 8 is a block diagram illustrating a configuration of a control device according to an embodiment 2.

FIG. 8 is a block diagram illustrating the configuration of a control device 7 according to an exemplary embodiment 2.

A charge-discharge system 1 according to this exemplary embodiment 2 has substantially the same configuration as the charge-discharge system 1 according to this exemplary embodiment 1 except that the control device 7 stores a program 73 (stored in a computer-readable recording medium 80) for estimation of deterioration, a degree-of-deterioration DB 74, a use history DB 75, and a learning model DB 76 in a memory unit 72.

The learning model DB 76 stores a first learning model, a second learning model, and a third learning model described later.

The degree-of-deterioration DB 74 has substantially the same configuration as the degree-of-deterioration DB 34.

FIG. 9 is an explanatory view illustrating one example of a record layout of the use history DB 75.

The use history DB 75 stores, for each battery 2, a derivation history at each point of time of estimation, a specific gravity of an electrolyte solution, a thickness of a positive electrode grid, diagnosis information, degrees of deterioration factors, degrees of actually-measured deterioration factors, and a degree of deterioration, and an actually-measured degree of deterioration. FIG. 9 illustrates use histories of the batteries 2 each having an identification number No. 1 (ID No. 1). A history column, a positive electrode grid thickness column, and a diagnosis information column store substantially the same contents as the history column, the positive electrode grid thickness column, and the diagnosis information column of the degree-of-deterioration DB 34.

A specific gravity column stores specific gravities each specified by inputting a use history at each point of time of estimation to the first learning model.

As will be described later, a first degree column, a second degree column, a third degree column, and a fourth degree column store a first degree, a second degree, a third degree, and a fourth degree specified by inputting the use histories and the specific gravities that are specified at respective points of time of estimation into the second learning model.

The degree-of-deterioration column stores the degrees of deterioration estimated by inputting the first degree, the second degree, the third degree, and the fourth degree that are specified into the third learning model.

The actually-measured specific gravity column stores the actually-measured specific gravities.

The actually-measured first degree column, the actually-measured second degree column, the actually-measured third degree column, and the actually-measured fourth degree column respectively store the first degree, the second degree, the third degree, and the fourth degree that are obtained by actual measurement.

The actually-measured degree-of-deterioration column stores the degrees of deterioration that are determined by obtaining states of health (SOHs) by actual measurement.

The degrees of deterioration factors by actual measurement and the degrees of deterioration by actual measurement are obtained to be used in relearning that is described later. Accordingly, it is unnecessary to obtain the degrees of deterioration factors by actual measurement and the degrees of deterioration by actual measurement at all points of time of estimation.

Figure 10:
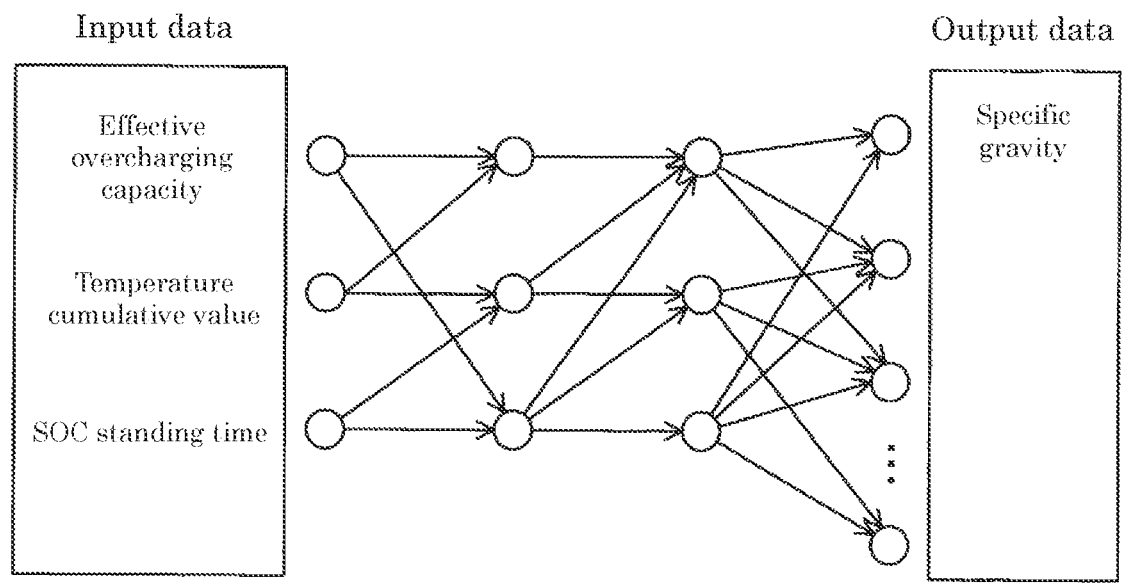
FIG. 10 is a schematic diagram illustrating an example of a first learning model.

FIG. 10 is a schematic view illustrating one example of the first learning model.

The first learning model is a learning model expected to be used as a program module that is a part of artificial intelligence software. The first learning model can use a multilayer neural network (deep learning). For example, the first learning model can use a convolutional neural network (CNN). The first learning model may also use a recurrent neural network (RNN). In the case where RNN is used as the first learning model, a change in the history with time is inputted. Other machine learnings such as decision trees, random forests, support vector machines, and the like may also be used. The control unit 71 is configured to perform an operation in such a manner that the control unit 71 applies an arithmetic operation to the history information inputted to an input layer of the first learning model in accordance with a command from the first learning model, and outputs the specific gravity and the probability of the specific gravity. Two intermediate layers are illustrated in FIG. 10 for the sake of convenience. However, the number of intermediate layers is not limited to two, and may be three or more. In the case where the first learning model uses CNN, CNN includes a convolution layer and a pooling layer. The number of nodes (neurons) is also not limited to the number adopted in the case illustrated in FIG. 10.

One or a plurality of nodes exist in the input layer, the output layer and the intermediate layer. The nodes in each layer are coupled to the nodes existing in preceding and succeeding layers in one direction with desired weighting respectively. A vector having the same number of components as the number of nodes in the input layer is given as input data to the first learning model (input data for learning and input data for specifying the degrees of deterioration factors). The learned input data includes, as the derivation history information, an effective overcharge capacity, a temperature cumulative value, an SOC stay time, and the like. The input information is not limited to the above-mentioned information. As the design information, the specific gravity of the initial electrolyte solution may be inputted.

The input layer of the first learning model inputs derivation histories such as an effective overcharge capacity, a cumulative temperature value, and an SOC stay time. When data given to the respective nodes in the input layer are given to the first intermediate layer by inputting, an output from the intermediate layer is calculated using weighting and an activation function. The calculated values are given to the next intermediate layer. Then, in the substantially same manner, the calculated values are successively transmitted to subsequent layers (low-order layers) until an output from the output layer is obtained. All weightings for coupling the nodes to each other are calculated by a learning algorithm.

An output layer of the first learning model generates specific gravities as output data. The number of nodes in the output layer corresponds to the number of candidates for the specific gravities. The output layer outputs the respective specific gravities and probabilities of the respective specific gravities.

The output layer outputs the specific gravities and the probabilities of the respective specific gravities as follows, for example.

| | |
|---|---|
| specific gravity 1.100 . . . | 0.01 |
| specific gravity 1.240 . . . | 0.07 |
| specific gravity 1.300 . . . | 0.88 |
| . . . | |

Although the case has been described where the learning model 156 is CNN, RNN can be used as the first learning model as described previously. In the case where RNN is used as the first learning model, RNN is used by making the intermediate layer at a preceding point of time match with the input layer at a succeeding point of time.

Figure 11:
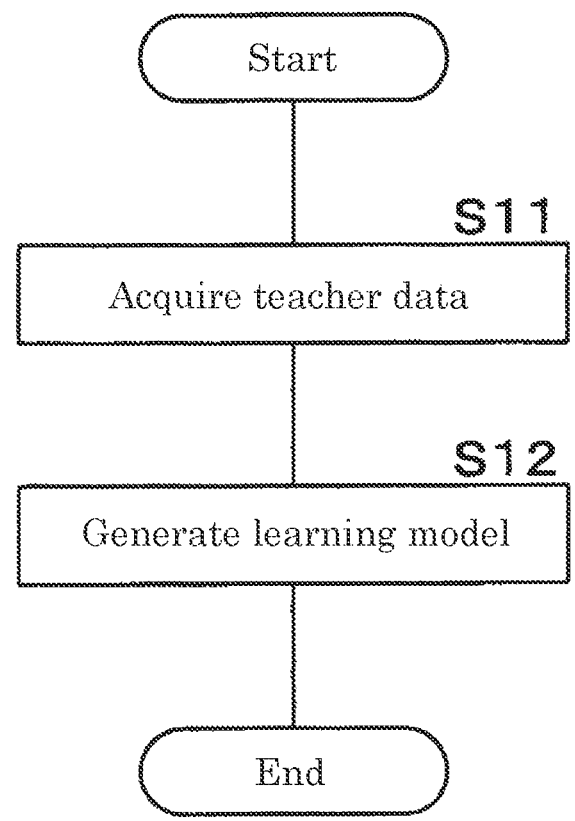
FIG. 11 is a flowchart illustrating steps of processing for generating the first learning model by a control unit.

FIG. 11 is a flowchart illustrating steps of processing for generating the first learning model by the control unit 71.

The control unit 71 reads the degree-of-deterioration DB 74 and acquires teacher data in which the histories and the specific gravity in each row are associated with each other (S11).

Using the teacher data, the control unit 71 generates the first learning model (learned model) that outputs the specific gravity when the derivation history is inputted (S12). Specifically, the control unit 71 inputs teacher data to the input layer, performs arithmetic processing in the intermediate layers, and acquires the specific gravity and the probability of the specific gravity from the output layer.

The control unit 71 compares the specified result of each specific gravity outputted from the output layer with information labeled to the history information in the teacher data, that is, a correct value. Then, the control unit 71 optimizes parameters used in the arithmetic processing performed in the intermediate layers so that an output value from the output layer approaches the correct value. The parameters are, for example, weighting (a coupling coefficient), a coefficient of an activation function and the like described above. A method of optimizing the parameters is not particularly limited. However, for example, the control unit 71 optimizes various parameters using an error back propagation method.

The control unit 71 generates a first learning model by performing the above-mentioned processing with respect to the history information of each teacher data contained in the degree-of-deterioration DB 74. The control unit 71 stores the generated first learning model in the memory unit 72, and finishes the series of processing.

Figure 12:
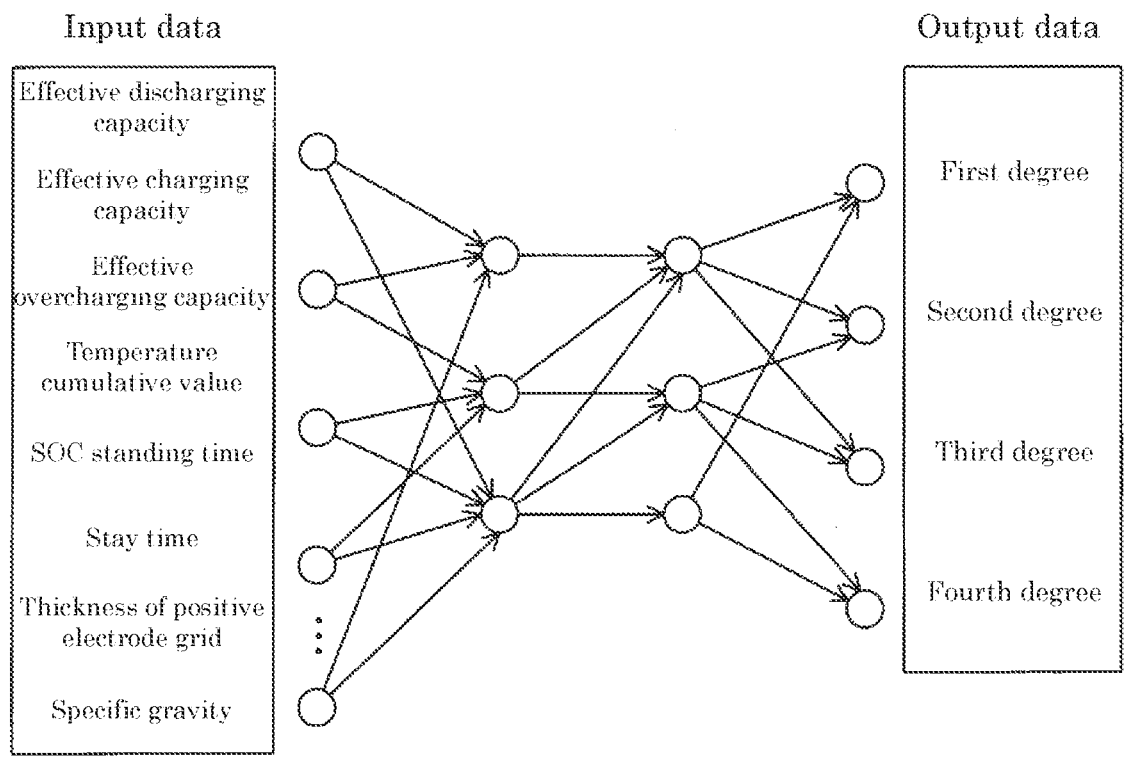
FIG. 12 is a schematic view illustrating an example of a second learning model.

FIG. 12 is a schematic view illustrating one example of the second learning model.

The second learning model is a learning model expected to be used as a program module that is a part of artificial intelligence software. For example, the second learning model can use a CNN. However, the second learning model may also use an RNN. In the case where RNN is used as the first learning model, a change in the history with time is inputted. Other machine learnings may be used. The control unit 71 is configured to perform an operation in such a manner that the control unit 71 applies an arithmetic operation to the history and the specific gravity inputted to an input layer of the second learning model in accordance with a command from the second learning model, and outputs a first degree, a second degree, a third degree, and a fourth degree, and the probabilities of the first to fourth degrees. Two intermediate layers are illustrated in FIG. 12 for the sake of convenience. However, the number of intermediate layers is not limited to two, and may be three or more. The number of nodes (neurons) is also not limited to the number adopted in the case illustrated in FIG. 12.

An output layer of the second learning model generates the first degree, the second degree, the third degree and the fourth degree as output data. The number of nodes in the output layer corresponds to the number of the degrees of deterioration. For example, in a case where the first degree is expressed by evaluation values of 0 to 5, the evaluation value of 0 to 5 and the probabilities corresponding to the respective evaluation values are outputted from the node of the first degree.

The output layer outputs the evaluation values and the probabilities as follows, for example.

| first degree | |
|---|---|
| 0 . . . | 0.08 |
| 1 . . . | 0.78 |
| . . . | |
| 5 . . . | 0.01 |
| . . . | |

| -continued | |
|---|---|
| fourth degree | |
| 0 . . . | 0.04 |
| 1 . . . | 0.82 |
| . . . | |
| 5 . . . | 0.01 |

For each degree, the control unit 71 acquires an evaluation value having the maximum probability or an evaluation value having a probability equal to or greater than a threshold value.

An output layer of the second learning model may output, as output data, the combinations of the first degree, the second degree, the third degree and the fourth degree, and the probabilities of the combinations.

The output layer outputs the combinations of degrees and the probabilities of the combinations of degrees as follows, for example.

| first degree 1, second degree 3, third degree 3, and fourth degree 0 . . . | 0.91 |
|---|---|
| first degree 1, second degree 2, third degree 2, fourth degree 1 . . . | 0.08 |
| . . . | |

Figure 13:
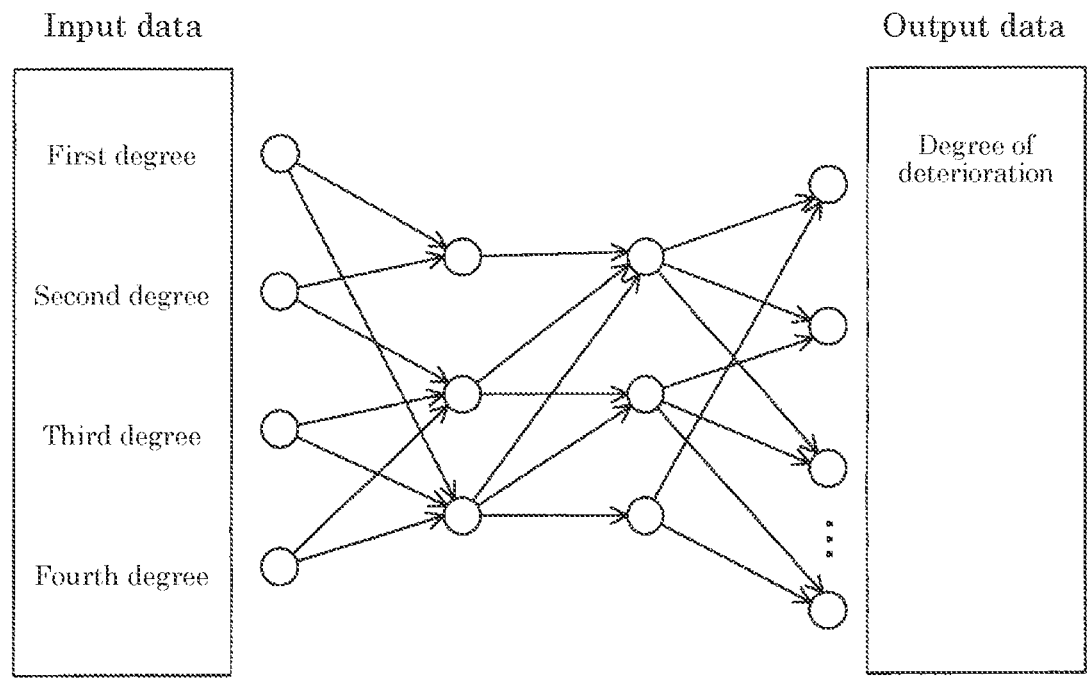
FIG. 13 is a schematic view illustrating an example of a third learning model.

FIG. 13 is a schematic view illustrating one example of the third learning model.

The third learning model is a learning model expected to be used as a program module that is a part of artificial intelligence software. For example, the third learning model can use a CNN. However, the third learning model may also use a RNN. In the case where RNN is used as the third learning model, a change in the degree of deterioration factor with time is inputted. Other machine learnings may be used. The control unit 71 is configured to perform an operation in such a manner that the control unit 71 applies an arithmetic operation to the first degree, the second degree, the third degree and the fourth degree inputted to an input layer of the third learning model in accordance with a command from the third learning model, and outputs a degree of deterioration of the battery 2 and the probability of the degree of deterioration. Two intermediate layers are illustrated in FIG. 13 for the sake of convenience. However, the number of intermediate layers is not limited to two, and may be three or more. The number of nodes is also not limited to the number adopted in the case illustrated in FIG. 13.

The first degree, the second degree, the third degree, and the fourth degree are inputted to the input data. The input data includes one or more degrees.

An output layer of the third learning model generates the degree of deterioration as output data. The number of nodes in the output layer corresponds to the number of the degrees of deterioration. For example, when the degrees of deterioration are expressed by numerical values from 1 to 10, the number of nodes can be set to 10. The output layer outputs the respective degrees of deterioration, and probabilities of the respective degrees of deterioration.

The output layer outputs, for example, the degrees of deterioration as follows.

| degree of deterioration 1 . . . | 0.01 |
|---|---|
| degree of deterioration 2 . . . | 0.07 |
| degree of deterioration 3 . . . | 0.88 |
| . . . | |

The third learning model is generated in the same manner as the first learning model.

Figure 14:
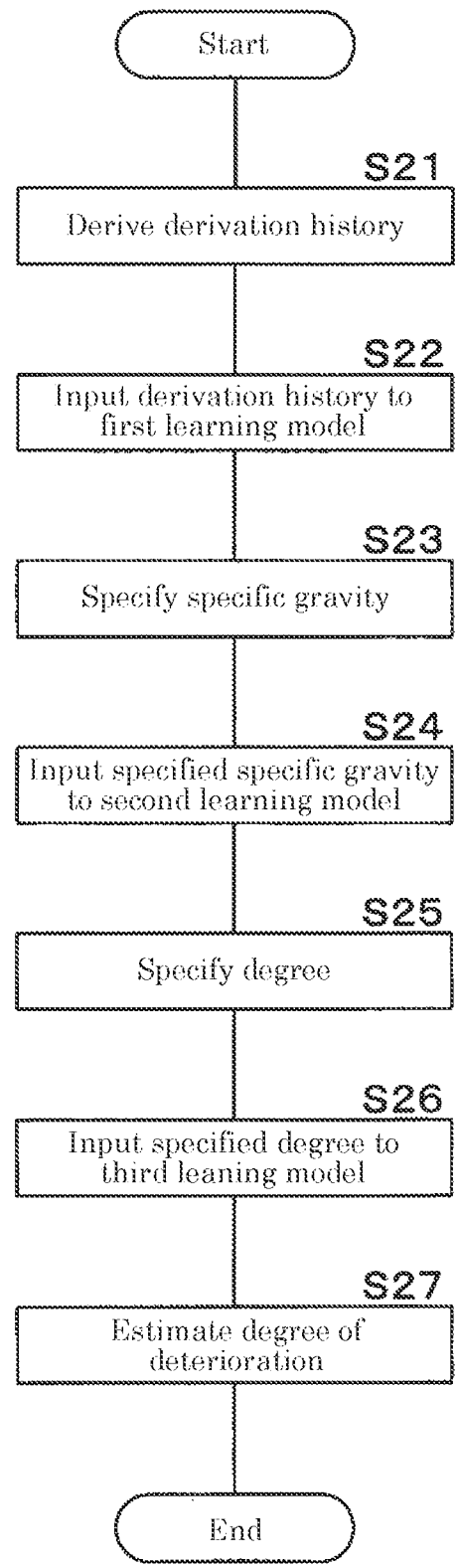
FIG. 14 is a flowchart illustrating steps of processing for estimating the degree of deterioration by a control unit.

FIG. 14 is a flowchart illustrating steps of processing for estimating the degree of deterioration by the control unit 71.

With respect to the battery 2 having the identification number No. 1, the control unit 71 derives derivation history such as a lifetime effective discharge capacity at a point of time of estimation, and stores the derivation history in the use history DB 75 (S21). The control unit 71 may also store the design information and the diagnosis information.

The control unit 71 reads the learning model DB 76, and inputs the derivation history to the first learning model (S22).

The control unit 71 specifies the specific gravity having the highest probability among the specific gravities outputted from the first learning model (S23).

The control unit 71 inputs the derivation history and the specified specific gravity to the second learning model (S24).

The control unit 71 specifies the degree of deterioration factor where the probability of the evaluation value is equal to or greater than a threshold value (S25).

The control unit 71 inputs the specified degree of deterioration factor to the third learning model (S26).

The control unit 71 estimates the degree of deterioration by acquiring the degree of deterioration having the highest probability, for example, among the degrees of deterioration that the third learning model outputs (S27), and finishes the processing.

According to this exemplary embodiment, the specific gravity can be easily and satisfactorily specified using the first learning model, and the degree of deterioration factor can be easily and satisfactorily specified using the second learning model based on the specified specific gravity and the derivation history. The deterioration of the battery 2 can be easily and satisfactorily estimated using the third learning model based on the degree of the specified deterioration factor.

The control unit 71 can cause the first learning model to the third learning model to relearn so that the reliability of the estimation of the degree of deterioration is improved based on the degree of deterioration estimated using the second learning model and the third learning model, and the degree of deterioration obtained by actual measurement. For example, with respect to the identification number No. 2 in the use history DB 75 illustrated in FIG. 9, the degree of deterioration factor estimated by the second learning model and the actually measured degree agree with each other. Accordingly, it is possible to increase the probability of the degree by causing the second learning model to relearn by inputting a large number of teacher data where the degree is associated with the derivation history of the identification number No. 2. In the same manner as described above, with respect to the identification number No. 2, the degree of deterioration estimated by the third learning model and the actually measured degree of deterioration agree with each other. Accordingly, it is possible to increase the probability of the degree of deterioration by causing the third learning mode to relearn by inputting a large number of teacher data where the degree of deterioration is associated with the degree of the deterioration factor of the identification number No. 2. With respect to the identification number No. 3, the third degree does not agree with the actually measured third degree. Accordingly, the degree of deterioration does not agree with the actually measured degree of deterioration. The teacher data in which the actually-measured first degree, the actually-measured second degree, the actually-measured third degree, and the actually-measured fourth degree are associated with the use history is inputted and the third learning model is relearned. Further, an actual measurement value of the specific gravity may be obtained, and the first learning model may be relearned using the actual measurement value of the specific gravity.

When the control unit 71 determines that the battery 2 has been exchanged based on the estimated degree of deterioration or diagnosis information and a preliminarily set threshold value, the control unit 71 may erase and reset data in the use history DB 75. The control unit 71 may perform an operation other than resetting the data in the use history DB 75 when the control unit 71 determines that the battery 2 has been exchanged. That is, the control unit 71 may set, when the control unit 71 determines that the battery 2 has been exchanged, a point of time that the cumulation of the history information that is stored in the use history DB 75 is started as the point of time at which the battery 2 has been exchanged.

In this exemplary embodiment, the case is described where the specific gravity and the degree of the deterioration factor are specified using the first learning model and the second learning model, and the degree of deterioration is estimated using the third learning model. However, the present invention is not limited to such a case. One or two learning models may be used among three learning models, and the other items may be obtained by relational expressions or the like.

Embodiment 3

A charge-discharge system 1 according to this exemplary embodiment 3 has substantially the same configuration as the charge-discharge system 1 according to this exemplary embodiment 2 except that a learning model DB 76 stores learning models A, B, C, and D that receive inputting of a derivation history and output probabilities of evaluation values of a first degree, a second degree, a third degree, and a fourth degree, respectively.

Figure 15:
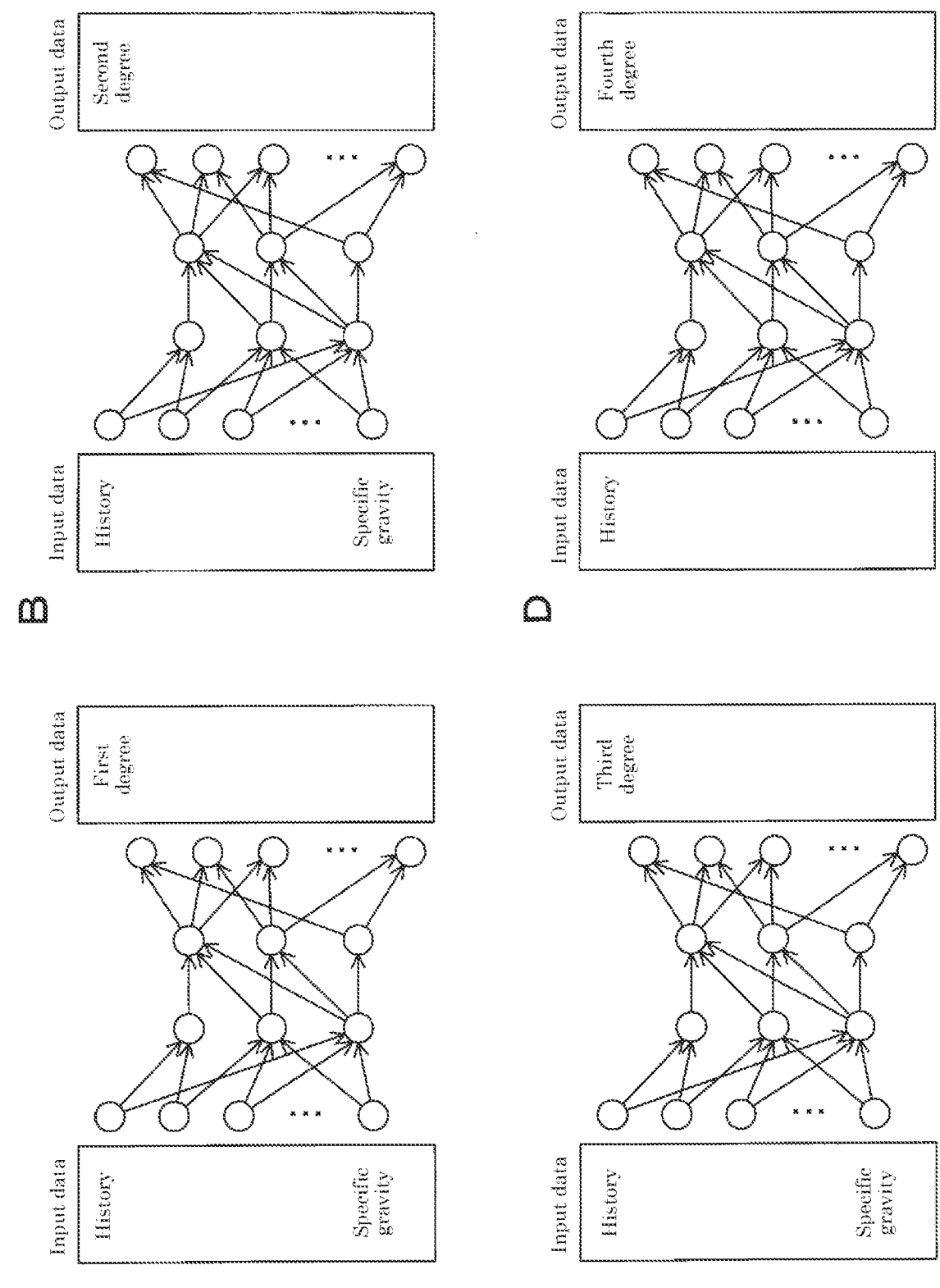
FIG. 15 is a schematic view illustrating one example of learning models A, B, C, and D.

FIG. 15 is a schematic view illustrating one example of the learning models A, B, C, and D.

The learning model A is a learning model expected to be used as a program module that is a part of artificial intelligence software. For example, the learning model A can use a CNN. However, the learning model A may also use an RNN. Other machine learnings may be used. A control unit 71 is configured to perform an operation in such a manner that the control unit 71 applies an arithmetic operation to the derivation history and the specific gravity inputted to an input layer of the learning model A in accordance with a command from the learning model A, and outputs the first degree of the battery 2 and the probability of the first degree of the battery 2. Two intermediate layers are illustrated in FIG. 15 for the sake of convenience. However, the number of intermediate layers is not limited to two, and may be three or more. The number of nodes is also not limited to the number adopted in the case illustrated in FIG. 15.

First histories such as lifetime effective discharge capacity, a temperature cumulative value, and a use period, and a specified specific gravity are inputted to the input layer of the learning model A.

The output layer of the learning model A outputs first degrees. The number of nodes in the output layer corresponds to the number of the degrees of the first degrees. For example, when the first degree is expressed by numerical values from 0 to 5, the number of nodes can be set to 6. The output layer outputs the evaluation values of the first degrees and the probabilities of the respective evaluation values.

The output layer outputs, for example, the degrees as follows.

| | |
|---|---|
| first degree 0 ... | 0.01 |
| first degree 1 ... | 0.87 |
| first degree 2 ... | 0.08 |
| ... | |

The control unit 71 reads the degree-of-deterioration DB 74, acquires teacher data where the first degrees are associated with the first histories and the specific gravities, and generates the learning model A using the teacher data.

Second histories such as lifetime effective overcharge capacity, a temperature cumulative value, and a use period, and a specified specific gravity are inputted to the input layer of the learning model B.

The output layer of the learning model B outputs second degrees. The number of nodes in the output layer corresponds to the number of the degrees of the second degrees. For example, when the second degree is expressed by numerical values from 0 to 5, the number of nodes can be set to 6. The output layer outputs the evaluation values of the second degrees and the probabilities of the respective evaluation values.

The control unit 71 reads the degree-of-deterioration DB 74, acquires teacher data where the second degrees are associated with the second histories and the specific gravities, and generates the learning model B using the teacher data.

Third histories such as lifetime effective charge capacity, a temperature cumulative value, a use period, a standing time, and a stay time in each SOC section, and a specified specific gravity are inputted to the input layer of the learning model C.

The output layer of the learning model C outputs third degrees. The number of nodes in the output layer corresponds to the number of the third degrees. For example, when the third degree is expressed by numerical values from 0 to 5, the number of nodes can be set to 6. The output layer outputs the evaluation values of the third degrees and the probabilities of the respective evaluation values.

The control unit 71 reads the degree-of-deterioration DB 74, acquires the teacher data where the third degrees are associated with the third histories and the specific gravities, and generates the learning model C using the teacher data.

Histories such as lifetime effective charge capacity, a temperature cumulative value, and a use period are inputted to the input layer of the learning model D.

The output layer of the learning model D outputs fourth degrees. The number of nodes in the output layer corresponds to the number of the fourth degrees. For example, when the fourth degree is expressed by numerical values from 0 to 5, the number of nodes can be set to 6. The output layer outputs the evaluation values of the fourth degrees and the probabilities of the respective evaluation values.

The control unit 71 reads the degree-of-deterioration DB 74, acquires teacher data where the fourth degrees are associated with the fourth histories and the specific gravities, and generates the learning model D using the teacher data.

Hereinafter, a method of estimating the degree of deterioration will be described.

Figure 16:
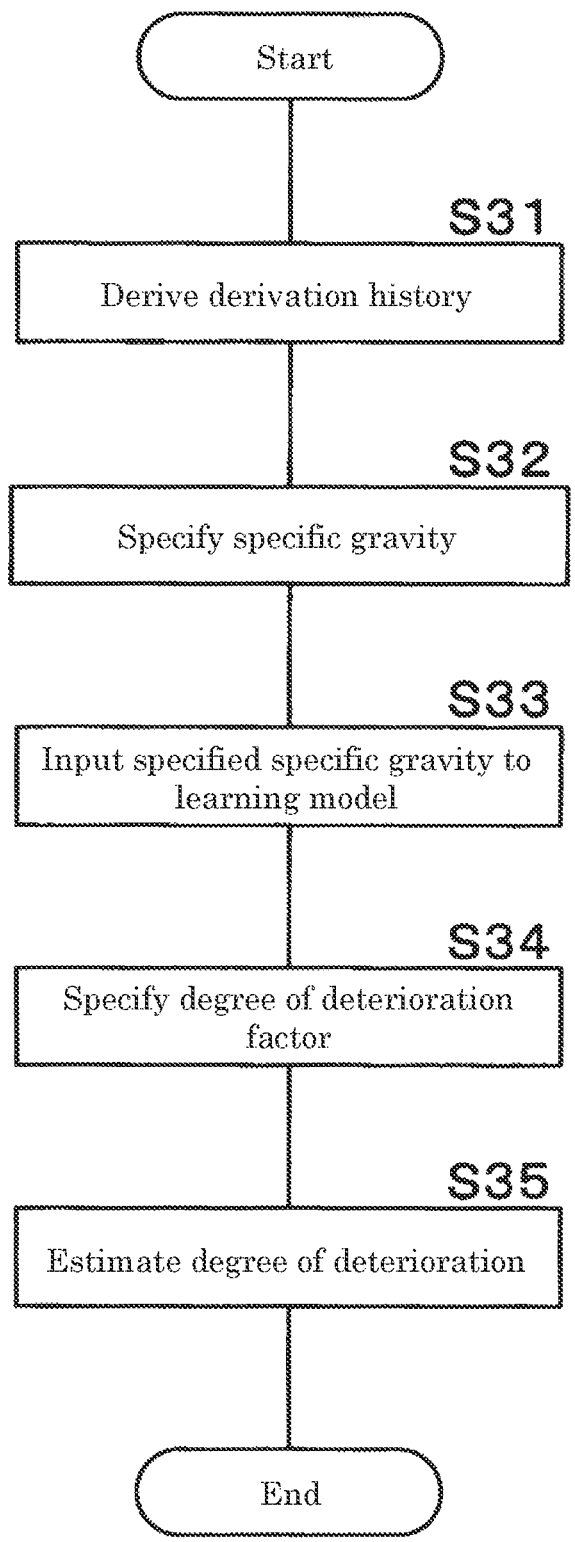
FIG. 16 is a flowchart illustrating steps of processing for estimating the degree of deterioration by a control unit.

FIG. 16 is a flowchart illustrating steps of processing for estimating the degree of deterioration by the control unit 71.

The control unit 71 performs the following processing at predetermined points of time of estimation.

With respect to the battery 2 having the identification number No. 1, the control unit 71 derives use histories such as lifetime effective discharge capacity and a temperature cumulative value based on a voltage, a current, and a temperature acquired at points of time of estimation, and stores the use histories in the use history DB 75 (S31).

The control unit 71 specifies the specific gravity in the same manner as processing in S2 or S23 described above (S32).

The control unit 71 reads the learning model DB 76, and inputs the first histories and the specific gravities to the learning model A (S33).

The control unit 71 specifies the first degree having the highest probability among the first degrees outputted from the learning model A, and stores the specified first degree in the use history DB 75 (S34).

The control unit 71 estimates the degree of deterioration based on the specified first degree (S35), stores the estimated degree of deterioration in the use history DB 75, and finishes the processing. The control unit 71 can estimate the degree of deterioration based on the relationship between the first degrees and the degrees of deterioration derived from the degree-of-deterioration DB 74. Alternatively, the degree of deterioration may be acquired by inputting the specified first degree to the third learning model.

Also with respect to the second degree and the third degree, in the same manner as described above, the degrees of deterioration can be estimated as follows. The second history or the third history and the specific gravity are inputted to the learning model B,C and the deterioration factor is specified by the learning model B,C. Then, the degree of deterioration is estimated based on the degree of the specified deterioration factor. Also with respect to the fourth degree, the degrees of deterioration can be estimated as follows. The fourth history is inputted to the learning model D and the deterioration factor is specified by the learning model D. Then, the degree of deterioration can be estimated based on the specified fourth degree.

According to this exemplary embodiment, the degrees of deterioration factors can be easily and satisfactorily specified using the learning models A to D, and the deterioration of the battery 2 can be easily and satisfactorily estimated based on the degree of the specified deterioration factor. The learning models A to D are not limited to the above-described cases. Design information may be inputted to the learning models A to D in addition to the histories.

The present invention is not limited to the contents of the above-described embodiments, and various modifications can be made within the scope defined by the claims. That is, embodiments acquired by combining technical means that are appropriately modified within the scope defined by the claims are also included in the technical scope of the present invention.

DESCRIPTION OF REFERENCE SIGNS 1 charge-discharge system
2 battery (energy storage device)
3 BMU
31, 71, 91 control unit (derivation unit, first specifying unit, second specifying unit, estimation unit, history erasing unit)
32, 72 memory unit
33, 73 program
34, 74 degree-of-deterioration DB 35, 75 use history DB
36 input unit
37, 77, 92 communication unit
7 control device
76 learning model DB
9 server
10 network
13 load

The invention claimed is:

1. An estimation device comprising:
a derivation unit configured to derive a derivation history based on a current and a voltage of a first lead-acid battery and a temperature of the first lead-acid battery acquired at an estimation time point;
a first specifying unit configured to specify a specific gravity of an electrolyte solution of the first lead-acid battery;
a second specifying unit configured to specify at least one degree out of: a first degree of softening of a positive electrode material; a second degree of corrosion of a positive electrode grid; a third degree of sulfation of a negative electrode; and a fourth degree of shrinkage of a negative electrode material based on the specified specific gravity, the derived derivation history, and at least one relationship selected from the group consisting of:
 a first relationship, which is obtained in advance, between a first history based on a specific gravity of an electrolyte solution and a current, a voltage and a temperature of a second lead-acid battery which is different from the first lead-acid battery, and the first degree;
 a second relationship, which is obtained in advance, between a second history based on a specific gravity of an electrolyte solution and a current, a voltage and a temperature of a third lead-acid battery which is different from the first lead-acid battery and the same as or different from the second lead-acid battery, and the second degree;
 a third relationship, which is obtained in advance, between a third history based on a specific gravity of an electrolyte solution and a current, a voltage and a temperature of a fourth lead-acid battery which is different from the first lead-acid battery and the same as or different from the second and third lead-acid batteries, and the third degree; and
 a fourth relationship, which is obtained in advance, between a fourth history based on a current, a voltage and a temperature of a fifth lead-acid battery which is different from the first lead-acid battery and the same as or different from the second, third and fourth lead-acid batteries, and the fourth degree; and
an estimation unit configured to estimate a degree of deterioration of the first lead-acid battery based on the specified at least one degree.

2. The estimation device according to claim 1, wherein the first specifying unit is configured to specify the specific gravity of the electrolyte solution of the first lead-acid battery by inputting the derived history to a first learning model that is configured to output a specific gravity of an electrolyte solution when a history based on a current and a voltage of a lead-acid battery and a temperature of the lead-acid battery is inputted to the first learning model.

3. The estimation device according to claim 1, wherein the second specifying unit is configured to specify at least one of the first degree, the second degree, the third degree and the fourth degree by inputting the derived derivation history and the specified specific gravity of the electrolyte solution of the first lead-acid battery to a second learning model that is configured to output at least one of the first degree, the second degree, the third degree and the fourth degree when a derivation history based on a current, a voltage and a temperature of a lead-acid battery and a specific gravity of an electrolyte solution are inputted to the second learning model.

4. The estimation device according to claim 1, wherein the estimation unit is configured to estimate the degree of deterioration of the first lead-acid battery by inputting the specified at least one degree to a third learning model that is configured to output the degree of deterioration of a lead-acid battery when at least one of the first degree, the second degree, the third degree and the fourth degree is inputted to the third learning model.

5. The estimation device according to claim 1, wherein the derivation history includes: an effective discharge capacity obtained by correcting a discharge capacity with a coefficient based on at least one of the temperature of the first lead-acid battery and the specific gravity of the electrolyte solution of the first lead-acid battery; an effective charge capacity obtained by correcting a charge capacity with a coefficient based on at least one of the temperature of the first lead-acid battery and the specific gravity of the electrolyte solution of the first lead-acid battery; or a temperature cumulative value obtained by integration by multiplying the temperature of the first lead-acid battery by a predetermined coefficient or a coefficient based on the specific gravity of the electrolyte solution of the first lead-acid battery.

6. The estimation device according to claim 1, wherein
the first relationship is between the first history, first design information of the second lead-acid battery and the first degree,
the second relationship is between the second history, second design information of the third lead-acid battery and the second degree,
the third relationship is between the third history, third design information of the fourth lead-acid battery and the third degree,
the fourth relationship is between the fourth history, fourth design information of the fifth lead-acid battery and the fourth degree,
the second specifying unit is configured to specify the at least one degree out of the first to third degrees based on the specific gravity of the electrolyte solution of the first lead-acid battery, the derivation history, and design information of the first lead-acid battery, and the at least one relationship selected from the group consisting of the first to third relationships, or specify the fourth degree based on the derivation history, the design information of the first lead-acid battery and the fourth relationship.

7. The estimation device according to claim 6, wherein the design information is at least one selected from the group consisting of a number of plates, an amount of a positive active material, a mass of the positive electrode grid, a thickness of the positive electrode grid, a design of the positive electrode grid, a density of the positive electrode material, composition of the positive electrode material, an amount and a kind of an additive in the positive electrode material, composition of a positive electrode alloy, presence or absence, a thickness, a material and gas permeability of a nonwoven fabric that is brought into contact with a positive electrode plate, an amount of a negative active material, an amount and a kind of carbon in the negative electrode material, an amount and a kind of an additive in the negative electrode material, a specific surface area of the negative electrode material, a kind and a concentration of an additive in the electrolyte solution, and an initial specific gravity and an initial amount of the electrolyte solution.

8. The estimation device according to claim 1, wherein the estimation unit is configured to estimate the degree of deterioration based on the at least one degree and diagnosis information of the first lead-acid battery.

9. The estimation device according to claim 8, wherein the diagnosis information is at least one selected from the group consisting of internal resistance, an open circuit voltage, and a state of charge (SOC).

10. The estimation device according to claim 8, further comprising:
    a memory unit configured to store the derivation history, and the degree of deterioration specified by the second specifying unit or the diagnosis information; and
    a history erasing unit configured to erase the derivation history, and the degree of deterioration or the diagnosis information, when estimation is made that the first lead-acid battery is exchanged based on the degree of deterioration or the diagnosis information, and a threshold value.

11. An estimation method comprising:
    deriving a derivation history based on a current and a voltage of a first lead-acid battery and a temperature of the first lead-acid battery acquired at an estimation time point;
    specifying a specific gravity of an electrolyte solution of the first lead-acid battery;
    specifying at least one degree out of: a first degree of softening of a positive electrode material; a second degree of corrosion of a positive electrode grid; a third degree of sulfation of a negative electrode; and a fourth degree of shrinkage of a negative electrode material based on the specified specific gravity, the derived derivation history, and at least one relationship selected from the group consisting of:
        a first relationship, which is obtained in advance, between a first history based on a specific gravity of an electrolyte solution and a current, a voltage and a temperature of a second lead-acid battery which is different from the first lead-acid battery, and the first degree;
        a second relationship, which is obtained in advance, between a second history based on a specific gravity of an electrolyte solution and a current, a voltage and a temperature of a third lead-acid battery which is different from the first lead-acid battery and the same as or different from the second lead-acid battery, and the second degree;
        a third relationship, which is obtained in advance, between a third history based on a specific gravity of an electrolyte solution and a current, a voltage and a temperature of a fourth lead-acid battery which is different from the first lead-acid battery and the same as or different from the second and third lead-acid batteries, and the third degree; and
        a fourth relationship, which is obtained in advance, between a fourth history based on a current, a voltage and a temperature of a fifth lead-acid battery which is different from the first lead-acid battery and the same as or different from the second, third and fourth lead-acid batteries, and the fourth degree; and
    estimating a degree of deterioration of the first lead-acid battery based on the specified at least one degree.

12. A non-transitory computer readable recording medium storing a computer program configured to cause a computer to execute processing comprising:
    deriving a derivation history based on a current and a voltage of a first lead-acid battery and a temperature of the first lead-acid battery;
    specifying a specific gravity of an electrolyte solution of the first lead-acid battery;
    specifying at least one degree out of: a first degree of softening of a positive electrode material; a second degree of corrosion of a positive electrode grid; a third degree of sulfation of a negative electrode; and a fourth degree of shrinkage of a negative electrode material based on the specified specific gravity, the derived derivation history, and at least one relationship selected from the group consisting of:
        a first relationship, which is obtained in advance, between a first history based on a specific gravity of an electrolyte solution and a current, a voltage and a temperature of a second lead-acid battery which is different from the first lead-acid battery, and the first degree;
        a second relationship, which is obtained in advance, between a second history based on a specific gravity of an electrolyte solution and a current, a voltage and a temperature of a third lead-acid battery which is different from the first lead-acid battery and the same as or different from the second lead-acid battery, and the second degree;
        a third relationship, which is obtained in advance, between a third history based on a specific gravity of an electrolyte solution and a current, a voltage and a temperature of a fourth lead-acid battery which is different from the first lead-acid battery and the same as or different from the second and third lead-acid batteries, and the third degree; and
        a fourth relationship, which is obtained in advance, between a fourth history based on a current, a voltage and a temperature of a fifth lead-acid battery which is different from the first lead-acid battery and the same as or different from the second, third and fourth lead-acid batteries, and the fourth degree; and
    estimating a degree of deterioration of the first lead-acid battery based on the specified at least one degree.

* * * * *